(12) United States Patent
Kim et al.

(10) Patent No.: US 10,920,142 B2
(45) Date of Patent: Feb. 16, 2021

(54) POLYSILOXANE-BASED COMPOUND, SILICON NITRIDE LAYER ETCHING COMPOSITION INCLUDING THE SAME

(71) Applicant: ENF TECHNOLOGY CO., LTD., Yongin-si (KR)

(72) Inventors: Dong Hyun Kim, Yongin-si (KR); Hyeon Woo Park, Yongin-si (KR); Du Won Lee, Yongin-si (KR); Jang Woo Cho, Suwon-si (KR); Myung Ho Lee, Hwaseong-si (KR)

(73) Assignee: ENF TECHNOLOGY CO., LTD., Yongin-si (KR)

( * ) Notice: Subject to any disclaimer, the term of this patent is extended or adjusted under 35 U.S.C. 154(b) by 0 days.

(21) Appl. No.: 16/435,315

(22) Filed: Jun. 7, 2019

(65) Prior Publication Data
US 2019/0382659 A1    Dec. 19, 2019

(30) Foreign Application Priority Data

Jun. 15, 2018 (KR) .................. 10-2018-0069010
Jun. 15, 2018 (KR) .................. 10-2018-0069142

(51) Int. Cl.
| | | |
|---|---|---|
| *C09K 13/06* | (2006.01) | |
| *H01L 21/311* | (2006.01) | |
| *C08G 77/28* | (2006.01) | |
| *C09K 13/08* | (2006.01) | |
| *C08G 77/30* | (2006.01) | |
| *C08G 77/04* | (2006.01) | |
| *C08G 77/26* | (2006.01) | |

(52) U.S. Cl.
CPC ............ *C09K 13/06* (2013.01); *C08G 77/045* (2013.01); *C08G 77/26* (2013.01); *C08G 77/28* (2013.01); *C08G 77/30* (2013.01); *C09K 13/08* (2013.01); *H01L 21/31111* (2013.01)

(58) Field of Classification Search
CPC ..................................................... C09K 13/06
See application file for complete search history.

(56) References Cited

U.S. PATENT DOCUMENTS

2014/0021400 A1* 1/2014 Coenjarts ............... H05K 3/067
                                                              252/79.4

* cited by examiner

*Primary Examiner* — Roberts P Culbert
(74) *Attorney, Agent, or Firm* — Knobbe Martens Olson & Bear LLP

(57) ABSTRACT

Provided are a polysiloxane-based compound, a selective etching composition with respect to a silicon nitride layer including the polysiloxane-based compound, and a method of manufacturing a semiconductor device including the etching composition. The silicon nitride layer etching composition including the polysiloxane-based compound may selectively etch the silicon nitride layer relative to a silicon oxide layer, and have a significantly excellent etch selectivity ratio, and a small change in etch rate and a small change in etch selectivity ratio with respect to the silicon nitride layer even when time for using the composition increases or the composition is repeatedly used.

15 Claims, No Drawings

POLYSILOXANE-BASED COMPOUND, SILICON NITRIDE LAYER ETCHING COMPOSITION INCLUDING THE SAME

CROSS-REFERENCE TO RELATED APPLICATIONS

This application claims priority under 35 U.S.C. § 119 to Korean Patent Application No. 10-2018-0069142, filed on Jun. 15, 2018 and Korean Patent Application No. 10-2018-0069010, filed on Jun. 15, 2018 in the Korean Intellectual Property Office, the disclosure of which is incorporated herein by reference in its entirety.

TECHNICAL FIELD

The following disclosure relates to a polysiloxane-based compound and a silicon nitride layer etching composition including the same, and a method of manufacturing a semiconductor device including an etching process using the same.

BACKGROUND

A silicon oxide layer ($SiO_2$) and a silicon nitride layer ($SiN_x$) are typical insulating layers used in a semiconductor manufacturing process. Among them, the silicon nitride layer is used as a cap layer, a spacer layer, or a hard mask layer in a semiconductor device. The silicon oxide layer and the silicon nitride layer may be used alone or one or more silicon oxide layers and one or more silicon nitride layers may be alternately stacked to be used. When manufacturing semiconductors, the silicon nitride layers and silicon oxide layers are etched.

SUMMARY

An embodiment of the present invention is directed to a selective etching composition with respect to a silicon nitride layer including a polysiloxane-based compound as an etching additive, and more specifically, to providing a polysiloxane-based compound, a silicon nitride layer etching composition with an improved etch selectivity ratio with respect to a silicon nitride layer including the same, and a method of manufacturing a semiconductor device including the same.

Specifically, an embodiment of the present invention is directed to providing a novel polysiloxane-based compound that is capable of being usefully used as an etching additive.

Another embodiment of the present invention is directed to providing an etching additive including a novel polysiloxane-based compound and capable of selectively etching a silicon nitride layer relative to a silicon oxide layer, and a silicon nitride layer etching composition including the same.

Still another embodiment of the present invention is directed to providing a silicon nitride layer etching composition capable of selectively etching a silicon nitride layer relative to a silicon oxide layer, and having a remarkably improved etch selectivity ratio.

Still another embodiment of the present invention is directed to providing a stable silicon nitride layer etching composition in which a change in etch rate and a change in etch selectivity ratio are small with respect to a silicon nitride layer even when an etching treatment time increases or the etching composition is repeatedly used.

In one general aspect, there is provided a polysiloxane-based compound represented by Chemical Formula 1 below:

[Chemical Formula 1]

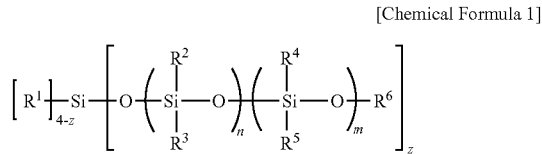

in Chemical Formula 1, $R^1$ is selected from hydrogen, hydroxy, (C1-C20)alkoxy, halogen, (C1-C20)alkyl, amino(C1-C20)alkyl, -L-$SO_3$H, —OP(=O)$(OH)_2$, -L-OP(=O)$(OH)_2$, -L-P(=O)$(OH)_2$, -L-P(=O)(OH)$R^{120}$, —OP(=O)(OH)$R^{110}$, and -L-OP(=O)(OH)$R^{100}$;

one of $R^2$ and $R^3$ is amino(C1-C20)alkyl, and the other is selected from hydrogen, hydroxy, (C1-C20)alkoxy, halogen, (C1-C20)alkyl, amino(C1-C20)alkyl, and —OP(=O)$(OH)_2$;

one of $R^4$ and $R^5$ is selected from -L-$SO_3$H, -L-OP(=O)$(OH)_2$, -L-P(=O)$(OH)_2$, -L-P(=O)(OH)$R^{120}$, and -L-OP(=O)(OH)$R^{100}$, and the other is selected from hydrogen, hydroxy, (C1-C20)alkoxy, halogen, —OP(=O)$(OH)_2$, (C1-C20)alkyl, -L-$SO_3$H, -L-OP(=O)$(OH)_2$, -L-P(=O)$(OH)_2$, -L-P(=O)(OH)$R^{120}$, —OP(=O)(OH)$R^{110}$, and -L-OP(=O)(OH)$R^{100}$;

$R^6$ is selected from hydrogen, (C1-C20)alkyl, —OP(=O)$(OH)_2$, —P(=O)$(OH)_2$, and —OP(=O)(OH)$R^{110}$;

$R^{100}$, $R^{110}$, and $R^{120}$ are each independently (C1-C20)alkyl;

L is (C1-C20)alkylene;

n and m are each independently an integer selected from 1 to 100; and z is an integer selected from 1 to 4.

In Chemical Formula 1, $R^1$ may be amino(C1-C20)alkyl; one of $R^2$ and $R^3$ is amino(C1-C20)alkyl, and the other may be selected from hydroxy, (C1-C20)alkoxy, —OP(=O)$(OH)_2$, and amino(C1-C20)alkyl; one of $R^4$ and $R^5$ may be -L-$SO_3$H, and the other may be selected from hydroxy, (C1-C20)alkoxy, —OP(=O)$(OH)_2$, and -L-$SO_3$H; $R^6$ may be selected from hydrogen, (C1-C20)alkyl, and —P(=O)$(OH)_2$; L may be (C1-C20)alkylene; n and m may be each independently an integer selected from 1 to 90; z may be an integer selected from 1 to 4; and two different repeating units denoted by n and m may be selected from a block form, a random form, and an alternating form, and the like.

In Chemical Formula 1, $R^1$ may be amino(C1-C7)alkyl; one of $R^2$ and $R^3$ is amino(C1-C7)alkyl, and the other may be selected from hydroxy, (C1-C7)alkoxy, —OP(=O)$(OH)_2$, and amino(C1-C7)alkyl; one of $R^4$ and $R^5$ may be -L-$SO_3$H, and the other may be selected from hydroxy, (C1-C7)alkoxy, —OP(=O)$(OH)_2$, and -L-$SO_3$H; $R^6$ may be selected from hydrogen, (C1-C7)alkyl, and —P(=O)$(OH)_2$; L may be (C1-C7)alkylene; n and m may be each independently an integer selected from 2 to 70; z may be an integer selected from 2 to 4; and two different repeating units denoted by n and m may be selected from a block form, a random form, and an alternating form, and the like.

Chemical Formula 1 may be at least one selected from the following structures:

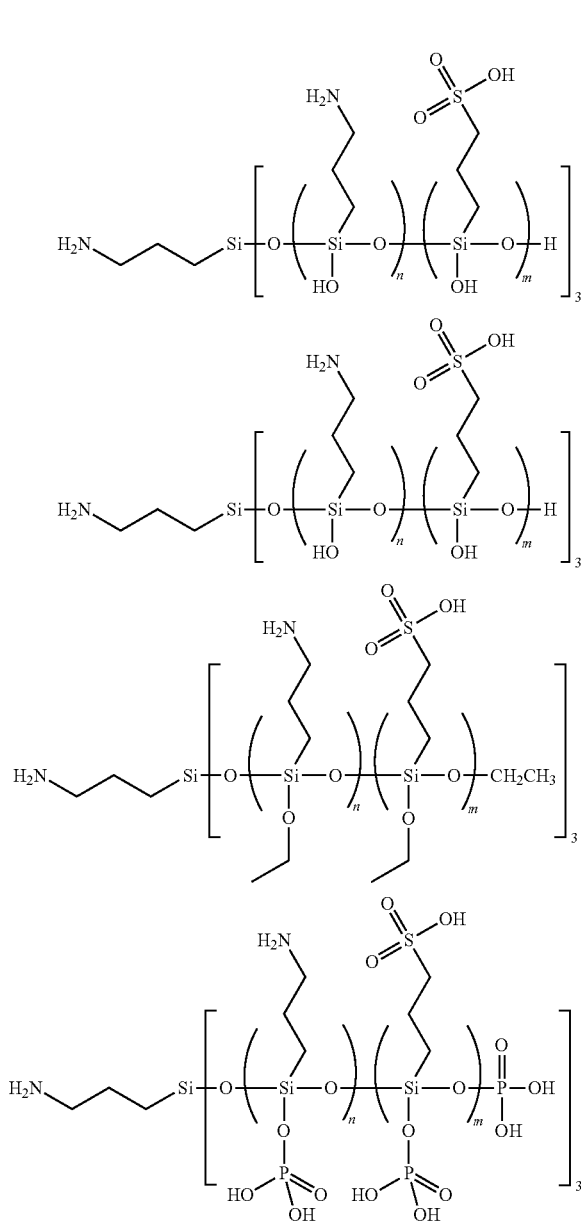

in structures above, n and m are each independently an integer selected from 1 to 100.

In another general aspect, there is provided an etching additive including the polysiloxane-based compound represented by Chemical Formula 1 above.

In still another general aspect, there is provided a silicon nitride layer etching composition including: a polysiloxane-based compound represented by Chemical Formula 1-1 below, a phosphoric acid, and water; wherein the polysiloxane-based compound is a mixture of a polysiloxane-based compound in which n is an integer of 0 and a polysiloxane-based compound in which m is an integer of 0, or a polysiloxane-based compound in which n and m are an integer of 1 or more:

[Chemical Formula 1-1]

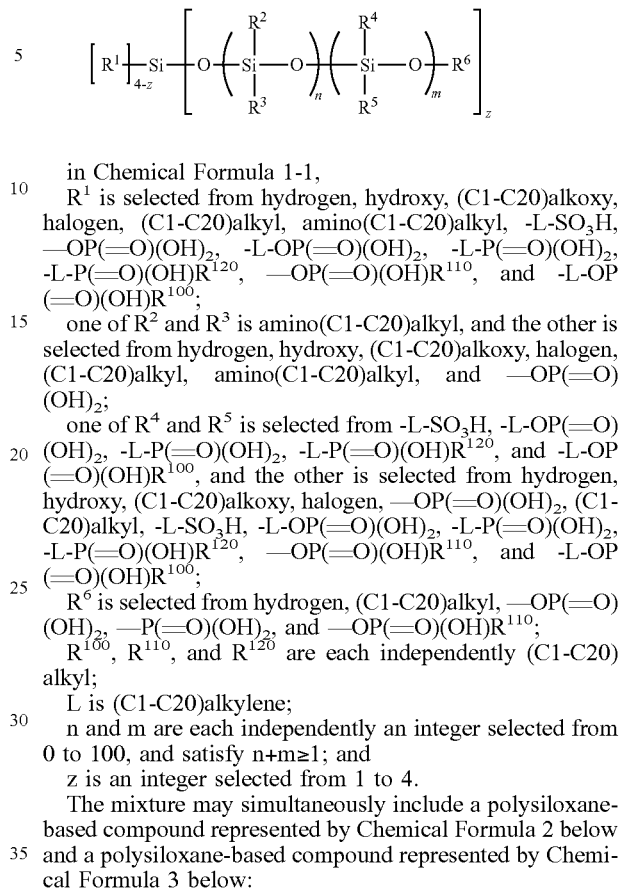

in Chemical Formula 1-1, $R^1$ is selected from hydrogen, hydroxy, (C1-C20)alkoxy, halogen, (C1-C20)alkyl, amino(C1-C20)alkyl, -L-$SO_3$H, —OP(=O)(OH)$_2$, -L-OP(=O)(OH)$_2$, -L-P(=O)(OH)$_2$, -L-P(=O)(OH)$R^{120}$, —OP(=O)(OH)$R^{110}$, and -L-OP(=O)(OH)$R^{100}$;

one of $R^2$ and $R^3$ is amino(C1-C20)alkyl, and the other is selected from hydrogen, hydroxy, (C1-C20)alkoxy, halogen, (C1-C20)alkyl, amino(C1-C20)alkyl, and —OP(=O)(OH)$_2$;

one of $R^4$ and $R^5$ is selected from -L-$SO_3$H, -L-OP(=O)(OH)$_2$, -L-P(=O)(OH)$_2$, -L-P(=O)(OH)$R^{120}$, and -L-OP(=O)(OH)$R^{100}$, and the other is selected from hydrogen, hydroxy, (C1-C20)alkoxy, halogen, —OP(=O)(OH)$_2$, (C1-C20)alkyl, -L-$SO_3$H, -L-OP(=O)(OH)$_2$, -L-P(=O)(OH)$_2$, -L-P(=O)(OH)$R^{120}$, —OP(=O)(OH)$R^{110}$, and -L-OP(=O)(OH)$R^{100}$;

$R^6$ is selected from hydrogen, (C1-C20)alkyl, —OP(=O)(OH)$_2$, —P(=O)(OH)$_2$, and —OP(=O)(OH)$R^{110}$;

$R^{100}$, $R^{110}$, and $R^{120}$ are each independently (C1-C20)alkyl;

L is (C1-C20)alkylene;

n and m are each independently an integer selected from 0 to 100, and satisfy n+m≥1; and z is an integer selected from 1 to 4.

The mixture may simultaneously include a polysiloxane-based compound represented by Chemical Formula 2 below and a polysiloxane-based compound represented by Chemical Formula 3 below:

[Chemical Formula 2]

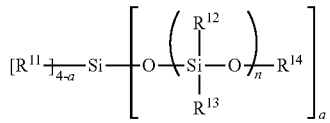

in Chemical Formula 2, $R^{11}$ is selected from hydrogen, hydroxy, (C1-C20)alkoxy, halogen, (C1-C20)alkyl, —OP(=O)(OH)$_2$, and amino(C1-C20)alkyl;

one of $R^{12}$ and $R^{13}$ is amino (C1-C20)alkyl, and the other is selected from hydrogen, hydroxy, (C1-C20)alkoxy, halogen, (C1-C20)alkyl, —OP(=O)(OH)$_2$, and amino(C1-C20)alkyl;

$R^{14}$ is selected from hydrogen, (C1-C20)alkyl, —OP(=O)(OH)$_2$, —P(=O)(OH)$_2$, and —OP(=O)(OH)$R^{110}$;

$R^{110}$ is (C1-C20)alkyl;

n is an integer selected from 1 to 100; and a is an integer selected from 1 to 4,

[Chemical Formula 3]

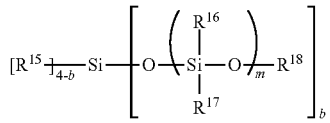

in Chemical Formula 3, $R^{15}$ is selected from hydrogen, hydroxy, (C1-C20)alkoxy, halogen, (C1-C20)alkyl, -L-SO$_3$H, —OP(=O)(OH)$_2$, -L-OP(=O)(OH)$_2$, -L-P(=O)(OH)$_2$, —OP(=O)(OH)R$^{110}$, -L-P(=O)(OH)R$^{120}$, and -L-OP(=O)(OH)R$^{100}$;

one of $R^{16}$ and $R^{17}$ is selected from -L-SO$_3$H, -L-OP(=O)(OH)$_2$, -L-P(=O)(OH)$_2$, -L-P(=O)(OH)R$^{120}$, and -L-OP(=O)(OH)R$^{100}$, and the other is selected from hydrogen, hydroxy, (C1-C20)alkoxy, halogen, (C1-C20)alkyl, -L-SO$_3$H, —OP(=O)(OH)$_2$, -L-OP(=O)(OH)$_2$, -L-P(=O)(OH)$_2$, —OP(=O)(OH)R$^{110}$, -L-P(=O)(OH)R$^{120}$, and -L-OP(=O)(OH)R$^{100}$;

$R^8$ is selected from hydrogen, (C1-C20)alkyl, —OP(=O)(OH)$_2$, —P(=O)(OH)$_2$, and —P(=O)(OH)R$^{110}$;

$R^{100}$, $R^{110}$, and $R^{120}$ are each independently (C1-C20)alkyl;

L is (C1-C20)alkylene;

m is an integer selected from 1 to 100; and b is an integer selected from 1 to 4.

In Chemical Formula 2, $R^{11}$ may be selected from hydroxy, (C1-C20)alkyl, and amino(C1-C20)alkyl; one of $R^{12}$ and $R^{13}$ may be amino(C1-C20)alkyl, and the other may be selected from hydroxy, (C1-C7)alkoxy, and amino(C1-C20)alkyl; $R^{14}$ may be selected from hydrogen, (C1-C20)alkyl, and —P(=O)(OH)$_2$; n may be an integer selected from 1 to 50; and a may be an integer selected from 1 to 4. In addition, in Chemical Formula 3, $R^{15}$ may be hydroxy, (C1-C20)alkyl, and -L-SO$_3$H; one of $R^{16}$ and $R^{17}$ may be -L-SO$_3$H, and the other may be selected from hydroxy, (C1-C20)alkoxy, and -L-SO$_3$H; $R^{18}$ may be selected from hydrogen, and (C1-C20)alkyl; L may be (C1-C20)alkylene; m may be an integer selected from 1 to 50; and b may be an integer selected from 1 to 4.

In Chemical Formula 2, $R^{11}$ may be selected from hydroxy, (C1-C7)alkyl, and amino(C1-C7)alkyl; one of $R^{12}$ and $R^{13}$ may be amino(C1-C7)alkyl, and the other may be selected from hydroxy, (C1-C7)alkoxy, and amino(C1-C7)alkyl; $R^{14}$ may be selected from hydrogen, (C1-C7)alkyl, and —P(=O)(OH)$_2$; n may be an integer selected from 2 to 20; and a may be an integer selected from 2 to 4. In addition, $R^{15}$ may be hydroxy, (C1-C7)alkyl, and -L-SO$_3$H; one of $R^{16}$ and $R^{17}$ may be -L-SO$_3$H, and the other may be selected from hydroxy, (C1-C7)alkoxy, and -L-SO$_3$H; $R^{18}$ may be selected from hydrogen, and (C1-C7)alkyl; L may be (C1-C7)alkylene; m may be an integer selected from 2 to 20; and b may be an integer selected from 2 to 4.

Chemical Formula 2 may be selected from the polysiloxane-based compound represented by Structural Formula 1 below and Chemical Formula 3 may be selected from the polysiloxane-based compound represented by Structural Formula 2 below:

[Structural Formula 1]

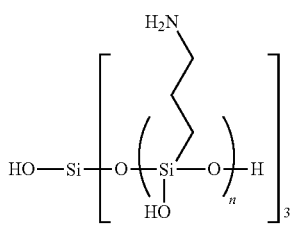

-continued

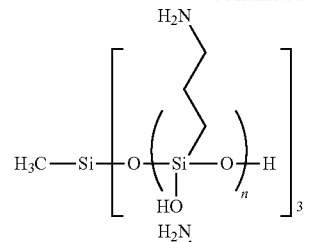

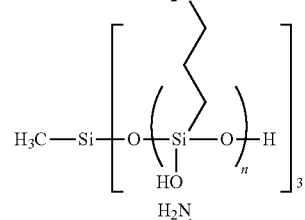

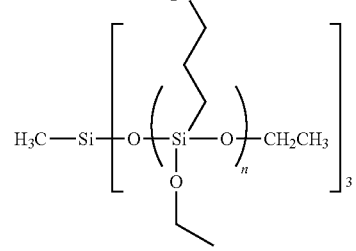

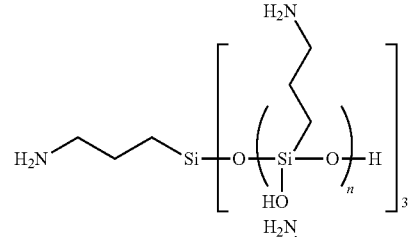

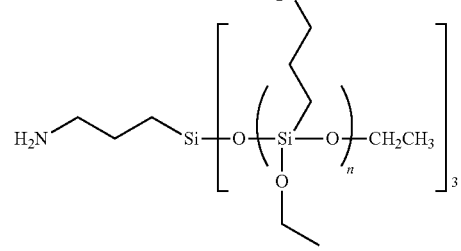

[Structural Formula 2]

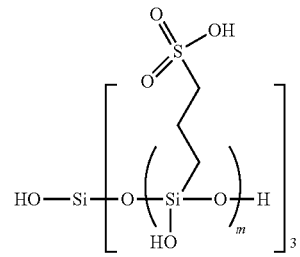

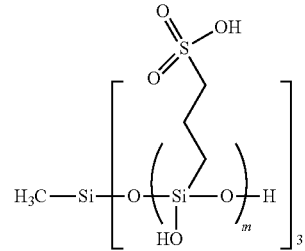

-continued

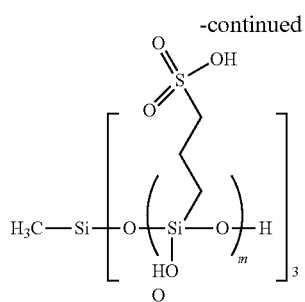

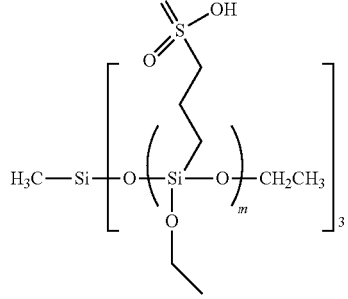

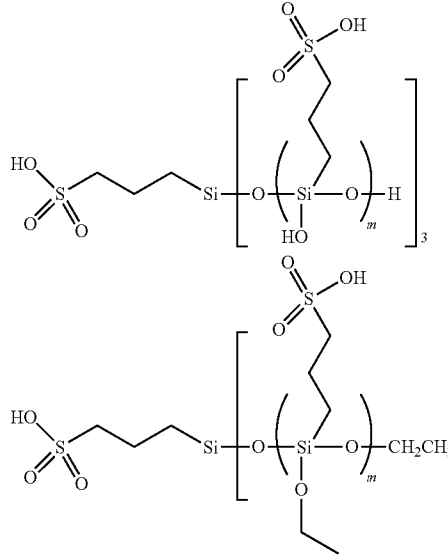

in Structural Formulas 1 and 2, n and m are each independently an integer selected from 1 to 100.

The mixture may include Chemical Formula 2 and Chemical Formula 3 in a weight ratio of 1:99 to 99:1.

In Chemical Formula 1-1, n and m may be each independently an integer selected from 1 to 90; $R^1$ may be amino(C1-C20)alkyl; one of $R^2$ and $R^3$ may be amino(C1-C20)alkyl, and the other may be selected from hydroxy, (C1-C20)alkoxy, —OP(=O)(OH)$_2$, and amino(C1-C20)alkyl; one of $R^4$ and $R^5$ may be -L-SO$_3$H, and the other may be selected from hydroxy, (C1-C20)alkoxy, —OP(=O)(OH)$_2$, and -L-SO$_3$H; $R^6$ may be selected from hydrogen, (C1-C20)alkyl, and —P(=O)(OH)$_2$; L may be (C1-C20)alkylene; z may be an integer selected from 1 to 4; and two different repeating units denoted by n and m may be selected from a block form, a random form, and an alternating form, and the like.

In Chemical Formula 1-1, $R^1$ may be amino(C1-C7)alkyl; one of $R^2$ and $R^3$ may be amino(C1-C7)alkyl, and the other may be selected from hydroxy, (C1-C7)alkoxy, —OP(=O)(OH)$_2$, and amino(C1-C7)alkyl; one of $R^4$ and $R^5$ may be -L-SO$_3$H, and the other may be selected from hydroxy, (C1-C7)alkoxy, —OP(=O)(OH)$_2$, and -L-SO$_3$H; $R^6$ may be selected from hydrogen, (C1-C7)alkyl, and —P(=O)(OH)$_2$; L may be (C1-C7)alkylene; n and m may be each independently an integer selected from 2 to 70; z may be 2 to 4; and two different repeating units denoted by n and m may be selected from a block form, a random form, and an alternating form, and the like.

Chemical Formula 1-1 may be at least one or more selected from the polysiloxane-based compound represented by Structural Formula 3 below:

[Structural formula 3]

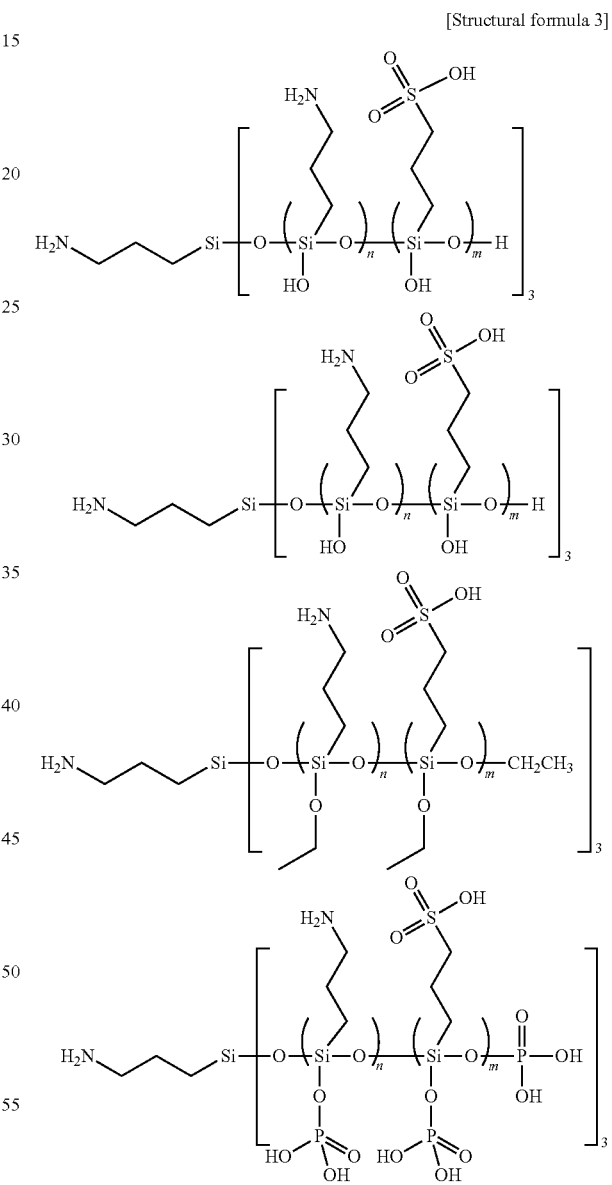

in Structural Formula 3, n and m are each independently an integer selected from 0 to 100, and satisfy n+m≥1.

The silicon nitride layer etching composition may include 0.005 to 10 wt % of the polysiloxane-based compound, 60 to 90 wt % of the phosphoric acid, and a remaining amount of water, based on a total weight of the composition.

The silicon nitride layer etching composition may satisfy an etch selectivity ratio represented by Relational Expression 1 below:

$$500 \leq E_{SiNx}/E_{SiO2} \qquad \text{[Relational Expression 1]}$$

in Relational Expression 1, $E_{SiNx}$ is an etch rate of a silicon nitride layer, and $E_{SiO2}$ is an etch rate of a silicon oxide layer.

In the silicon nitride layer etching composition, an etch rate drift of the silicon nitride layer after repeating an etching process may satisfy Relational Expression 2 below:

$$\Delta ERD_{SiNx} \leq 1\% \qquad \text{[Relational Expression 2]}$$

in Relational Expression 2, $\Delta ERD_{SiNx}$ is an etch rate drift relative to an initial etch rate with respect to the silicon nitride layer.

The silicon nitride layer etching composition may further include: an alcohol-based solvent.

The silicon nitride layer etching composition may further include: a fluorine-based compound.

In still another general aspect, there is provided a method of manufacturing a semiconductor device including: an etching process using the silicon nitride layer etching composition described above.

DETAILED DESCRIPTION OF EMBODIMENTS

Hereinafter, embodiments and examples of the present invention are discussed in more detail. It should be understood, however, that the following embodiments or Examples are only illustrative of the present invention in detail, and the present invention is not limited thereto and may be implemented in various forms.

In addition, unless defined otherwise, all technical and scientific terms used herein have the same meanings as commonly understood by one of those skilled in the art to which the present disclosure pertains. Terms used herein have purposes of describing particular embodiments only and are not intended to limit the present invention.

In addition, singular forms used in the specification and the appended claims are intended to include plural forms as well, unless otherwise specified in the context.

Silicon nitride layers may be etched using a mixture of high-purity phosphoric acid and deionized water at a high temperature of about 160° C. However, when using the high-purity phosphoric acid, an etch selectivity ratio of silicon nitride layers with respect to silicon oxide layers is reduced, and thus it is difficult to apply the high-purity phosphoric acid to a structure in which silicon nitride layers and silicon oxide layers are stacked. In addition, since a silicon nitride layer etching composition containing a phosphoric acid is continuously concentrated at a high temperature by evaporation of water to affect an etch rate of the nitride layer and the oxide layer, it is required to continuously supply deionized water. However, even when an amount of deionized water to be supplied is slightly changed, defects may be caused in removal of the silicon nitride layer, and the phosphoric acid itself is a strong acid and corrosive, which makes it difficult to handle.

In order to improve the etch selectivity ratio of the silicon nitride layer with respect to the silicon oxide layer, a silicon nitride layer etching composition in which a silicic acid is dissolved in a phosphoric acid may be used. However, when using the foregoing silicon nitride layer etching composition, there may be precipitates that are generated and abnormal growth in which a thickness of the silicon oxide layer rather increases when etching proceeds, which makes it difficult to apply the silicon nitride layer etching composition to a process.

In addition, a method of controlling an etch selectivity ratio by using a silicon compound containing an oxygen atom directly bonded to silicon may be used. However, the etch selectivity ratio of the silicon nitride layer relative to the silicon oxide layer is not high, and a silicic acid generated by etching the silicon nitride layer may still cause abnormal growth, causing various issues in a post-process.

The term "etch selectivity ratio ($E_{SiNx}/E_{SiO2}$)" as used herein means a ratio of a silicon nitride layer etch rate ($E_{SiNx}$) relative to a silicon oxide layer etch rate ($E_{SiO2}$). Further, a case where the silicon oxide layer etch rate is close to zero or a case where the etch selectivity ratio is large means that the silicon nitride layer is capable of being selectively etched.

The term "change in etch selectivity ratio" as used herein means an absolute value of a difference in the etch selectivity ratio relative to the initial etch selectivity ratio when the etching process is repeated twice or more using the same silicon nitride layer etching composition.

The term "etch rate drift ($\Delta ERD$)" as used herein means a change rate of the etch rate relative to the initial etch rate when the etching process is repeated twice or more using the same silicon nitride layer etching composition. In general, as the etching process is repeated, an etch performance, i.e., an etch rate, tends to decrease, and thus the drift is defined as a reduction rate, and the change rate is also interpreted in the same sense.

The term "silicon nitride layer" as used herein may be various silicon-based nitride layers such as a SiN layer, a SiON layer, and a doped SiN layer, and the like. As a specific example with a concept including the silicon-based nitride layer, the silicon nitride layer may be a layer quality which is mainly used as an insulating layer when forming a gate electrode or the like. However, the silicon nitride layer may be used without limitation as long as the silicon nitride layer is used in a technical field having a purpose of selectively etching the silicon nitride layer relative to the silicon oxide layer.

The term "silicon oxide layer" as used herein is not limited as long as the silicon oxide layer is a silicon oxide layer commonly used in the art. For example, the silicon oxide layer may be at least one layer selected from a spin on dielectric (SOD) layer, a high density plasma (HDP) layer, a thermal oxide layer, a borophosphate silicate glass (BPSG) layer, a phospho silicate glass (PSG) layer, a boro silicate glass (BSG) layer, a polysilazane (PSZ) layer, a fluorinated silicate glass (FSG) layer, a low pressure tetra ethyl ortho silicate (LP-TEOS) layer, a plasma enhanced tetra ethyl ortho silicate (PETEOS) layer, a high temperature oxide (HTO) layer, a medium temperature oxide (MTO) layer, an undoped silicate glass (USG) layer, a spin on glass (SOG) layer, an advanced planarization layer (APL), an atomic layer deposition (ALD) layer, a plasma enhanced oxide (PE-oxide) layer, and $O_3$-tetra ethyl ortho silicate ($O_3$-TEOS), and the like. However, this is merely a specific example, and the present invention is not limited thereto.

In addition, the unit of percentage (%) used herein without specific statement means the wt %, which indicates a weight percentage of any one component accounted for in the total of composition, unless otherwise defined.

The silicon nitride layer and the silicon oxide layer are typical insulating layers used in a semiconductor manufacturing process. In the semiconductor process, the silicon nitride layer is in contact with a silicon oxide layer, a polysilicon layer and a silicon wafer surface, and the like, and is deposited mainly by a chemical vapor deposition (CVD) process, which is removed by etching.

In a typical wet etching, the etch selectivity ratio of the silicon nitride layer with respect to the silicon oxide layer is lowered, and an etch selection property is changed when an etchant is used several times. Further, precipitates are generated and a thickness of the silicon oxide layer increases when the etching proceeds.

Accordingly, the present inventors conducted intensive research on a silicon nitride layer etching composition having a more improved etch selectivity ratio. As a result, the present inventors found that when treating with a specific etching additive, the etch selectivity ratio with respect to the silicon nitride layer relative to the silicon oxide layer was excellent and the abnormal growth was reduced.

Further, the present inventors found that the silicon nitride layer etching composition according to embodiments of the present invention exhibited excellent etch selection property with respect to the silicon nitride layer relative to the silicon oxide layer, and exhibited high stability, and thus the etch rate and the etch selectivity ratio with respect to the silicon nitride layer were maintained for a long period of time even when an etching treatment time and the number of treatment times increased, and completed the present invention.

Hereinafter, a polysiloxane-based compound according to embodiments of the present invention, an etching additive including the same, a selective etching composition with respect to a silicon nitride layer including the same, and a method of manufacturing a semiconductor device are described in more detail.

The novel polysiloxane-based compound according to embodiments of the present invention may be represented by Chemical Formula 1 below:

[Chemical Formula 1]

$$[R^1]_{4-z}-Si-\left[O-\left(\begin{array}{c}R^2\\|\\Si-O\\|\\R^3\end{array}\right)_n\left(\begin{array}{c}R^4\\|\\Si-O\\|\\R^5\end{array}\right)_m-R^6\right]_z$$

in Chemical Formula 1, $R^1$ is selected from hydrogen, hydroxy, (C1-C20)alkoxy, halogen, (C1-C20)alkyl, amino(C1-C20)alkyl, -L-SO$_3$H, —OP(=O)(OH)$_2$, -L-OP(=O)(OH)$_2$, -L-P(=O)(OH)$_2$, -L-P(=O)(OH)R$^{120}$, —OP(=O)(OH)R$^{110}$, and -L-OP(=O)(OH)R$^{100}$;

one of $R^2$ and $R^3$ is amino(C1-C20)alkyl, and the other is selected from hydrogen, hydroxy, (C1-C20)alkoxy, halogen, (C1-C20)alkyl, amino(C1-C20)alkyl, and —OP(=O)(OH)$_2$;

one of $R^4$ and $R^5$ is selected from -L-SO$_3$H, -L-OP(=O)(OH)$_2$, -L-P(=O)(OH)$_2$, -L-P(=O)(OH)R$^{120}$, and -L-OP(=O)(OH)R$^{100}$, and the other is selected from hydrogen, hydroxy, (C1-C20)alkoxy, halogen, —OP(=O)(OH)$_2$, (C1-C20)alkyl, -L-SO$_3$H, -L-OP(=O)(OH)$_2$, -L-P(=O)(OH)$_2$, -L-P(=O)(OH)R$^{120}$, —OP(=O)(OH)R$^{110}$, and -L-OP(=O)(OH)R$^{100}$;

$R^6$ is selected from hydrogen, (C1-C20)alkyl, —OP(=O)(OH)$_2$, —P(=O)(OH)$_2$, and —OP(=O)(OH)R$^{110}$;

$R^{100}$, $R^{110}$, and $R^{120}$ are each independently (C1-C20)alkyl;

L is (C1-C20)alkylene;

n and m are each independently an integer selected from 1 to 100; and z is an integer selected from 1 to 4.

When the polysiloxane-based compound is used as an etching additive, it is preferable that a Si—O bond present in the additive and a Si—O bond formed at the time of hydrolysis protect the silicon oxide layer to achieve a high etch selectivity ratio.

R in the "alkoxy (*—OR)" of $R^1$ to $R^5$ means a hydrocarbon chain including carbon and hydrogen, and may be a branched chain or a straight chain, and more specifically may be a straight chain, but is not limited thereto. Further, R in the alkoxy may be (C1-C20)alkyl, preferably (C1-C7) alkyl, and more preferably (C1-C5)alkyl. For example, R in the alkoxy may be —OCH$_3$, —OC$_2$H$_5$, —OC$_3$H$_7$, —OCH(CH$_3$)$_2$, —OC$_4$H$_9$, —OCH$_2$—CH(CH$_3$)$_2$, —OCH(CH$_3$)—C$_2$H$_5$, —OC(CH$_3$)$_3$, —OC$_5$H$_{11}$, —OCH(CH$_3$)—C$_3$H$_7$, —OCH$_2$—CH(CH$_3$)—C$_2$H$_5$, —OCH(CH$_3$)—CH(CH$_3$)$_2$, —OC(CH$_3$)$_2$—C$_2$H$_5$, —OCH$_2$—C(CH$_3$)$_3$, —OCH(C$_2$H$_5$)$_2$, —OC$_2$H$_4$—CH(CH$_3$)$_2$, —OC$_6$H$_{13}$, —OC$_3$H$_6$—CH(CH$_3$)$_2$, —OC$_2$H$_4$—CH(CH$_3$)—C$_2$H$_5$, —OCH(CH$_3$)—C$_4$H$_9$, —OCH$_2$—CH(CH$_3$)—C$_3$H$_7$, —OCH(CH$_3$)—CH$_2$—CH(CH$_3$)$_2$, —OCH(CH$_3$)—CH(CH$_3$)—C$_2$H$_5$, —OCH$_2$—CH(CH$_3$)—CH(CH$_3$)$_2$, —OCH$_2$—C(CH$_3$)$_2$—C$_2$H$_5$, —OC(CH$_3$)$_2$—C$_3$H$_7$, —OC(CH$_3$)$_2$—CH(CH$_3$)$_2$, —OC$_2$H$_4$—C(CH$_3$)$_3$, —OCH$_2$—CH(C$_2$H$_5$)$_2$, and —OCH(CH$_3$)—C(CH$_3$)$_3$, and the like, and preferably may be —OC$_2$H$_5$. However, the present invention is not limited thereto.

"Halogen" in $R^1$ to $R^5$ means a fluorine atom, a chlorine atom, a bromine atom, an iodine atom, or the like.

"Alkyl" in $R^1$ to $R^5$ means a hydrocarbon chain including carbon and hydrogen. The hydrocarbon chain may be a branched chain or a straight chain, and more specifically may be a straight chain, but is not limited thereto. The number of carbon atoms of the alkyl group may be C1 to C20, preferably C1 to C7, and more preferably C1 to C5. For example, the alkyl group may be —CH$_3$, —C$_2$H$_5$, —C$_3$H$_7$, —CH(CH$_3$)$_2$, —C$_4$H$_9$, —CH$_2$—CH(CH$_3$)$_2$, —CH(CH$_3$)—C$_2$H$_5$, —C(CH$_3$)$_3$, —C$_5$H$_{11}$, —CH(CH$_3$)—C$_3$H$_7$, —CH$_2$—CH(CH$_3$)—C$_2$H$_5$, —CH(CH$_3$)—CH(CH$_3$)$_2$, —C(CH$_3$)$_2$—C$_2$H$_5$, —CH$_2$—C(CH$_3$)$_3$, —CH(C$_2$H$_5$)$_2$, —C$_2$H$_4$—CH(CH$_3$)$_2$, —C$_6$H$_{13}$, —C$_3$H$_6$—CH(CH$_3$)$_2$, —C$_2$H$_4$—CH(CH$_3$)—C$_2$H$_5$, —CH(CH$_3$)—C$_4$H$_9$, —CH$_2$—CH(CH$_3$)—C$_3$H$_7$, —CH(CH$_3$)—CH$_2$—CH(CH$_3$)$_2$, —CH(CH$_3$)—CH(CH$_3$)—C$_2$H$_5$, —CH$_2$—CH(CH$_3$)—CH(CH$_3$)$_2$, —CH$_2$—C(CH$_3$)$_2$—C$_2$H$_5$, —C(CH$_3$)$_2$—C$_3$H$_7$, —C(CH$_3$)$_2$—CH(CH$_3$)$_2$, —C2H$_4$—C(CH$_3$)$_3$, —CH$_2$—CH(C2H$_5$)$_2$, and —CH(CH$_3$)—C(CH$_3$)$_3$, and the like. However, the present invention is not limited thereto.

In "aminoalkyl (*-L'-NH$_2$)" in $R^1$ to $R^3$, L' may be (C1-C20)alkylene, preferably (C1-C7)alkylene, and more preferably (C1-C5)alkylene. For example, L' may be NH$_2$—CH$_2$—, NH$_2$—CH$_2$—CH$_2$—, NH$_2$—CH(CH$_3$)—CH$_2$—, NH$_2$—CH$_2$—CH(CH$_3$)—, NH$_2$—CH$_2$—CH$_2$—CH$_2$—, NH$_2$—CH(CH$_3$)—CH$_2$—CH$_2$—, NH$_2$—CH$_2$—CH(CH$_3$)—CH$_2$—, NH$_2$—CH$_2$—CH$_2$—CH(CH$_3$)—, NH$_2$—CH$_2$—CH$_2$—CH$_2$—, and the like, and preferably, may be NH$_2$—CH$_2$—CH$_2$—CH$_2$—. However, the present invention is not limited thereto.

In "*-L-SO$_3$H" in $R^1$, $R^4$, and $R^5$, L may be (C1-C20)alkylene, preferably (C1-C7)alkylene, and more preferably (C1-C5)alkylene.

In "*-L-OP(=O)(OH)$_2$" or "*-L-P(=O)(OH)$_2$" in $R^1$, $R^4$, and $R^5$, L means a hydrocarbon chain including carbon and hydrogen, and may be a branched chain or a straight chain, and more specifically may be a straight chain. Further, L may be (C1-C20)alkylene, preferably (C1-C7)alkylene, and more preferably (C1-C5)alkylene.

In "*-L-P(=O)(OH)$R^{120}$" or "*-L-OP(=O)(OH)$R^{100}$" in $R^1$, $R^4$ and $R^5$, L, $R^{120}$, and $R^{100}$ mean a hydrocarbon chain including carbon and hydrogen, and may be a branched chain or a straight chain, and more specifically may be a straight chain. Further, L may be (C1-C20) alkylene, preferably (C1-C7)alkylene, and more preferably (C1-C5)alkylene. Further, $R^{100}$ and $R^{120}$ may be each independently (C1-C20)alkyl, preferably (C1-C7)alkyl, and more preferably (C1-C5)alkyl.

In "*—OP(=O)(OH)$R^{110}$" in $R^1$, $R^4$, $R^5$, and $R^6$, $R^{110}$ and L mean a hydrocarbon chain including carbon and hydrogen, and may be a branched chain or a straight chain, and more specifically may be a straight chain. Further, L may be (C1-C20)alkylene, preferably (C1-C7)alkylene, and more preferably (C1-C5)alkylene. Further, R may be (C1-C20)alkyl, preferably (C1-C7)alkyl, and more preferably (C1-C5)alkyl.

In an embodiment of the present invention, one of the substituents $R^4$ and $R^5$ in the repeating unit denoted by m may preferably be "*-L-$SO_3H$" as it is possible to provide an appropriate acid-base balance with the substituent amino (C1-C20)alkyl in the repeating unit denoted by n, and to exhibit stable etching properties regardless of the treatment time and the number of treatments together with etching properties of a better selectivity ratio.

In an embodiment of the present invention, n and m in Chemical Formula 1 may be each independently an integer selected from 1 to 100, but may be an integer selected from 1 to 90, and preferably an integer selected from 2 to 70, in order to facilitate control of the etch selectivity ratio and the etch rate as the etching additive.

In an embodiment of the present invention, z may be an integer selected from 1 to 4, and may be, but is not limited to, an integer selected from 2 to 4 in order to obtain high etch selectivity ratio as an etching additive.

In an embodiment of the present invention, the two different repeating units denoted by n and m may be selected from a block form, a random form, an alternating form, and the like, and may preferably be selected from a block form and a random form, and the like. However, the present invention is not limited thereto.

The polysiloxane-based compound represented by Chemical Formula 1 according to an embodiment of the present invention may be water-soluble and may be stably included in an aqueous silicon nitride layer etching composition since the polysiloxane-based compound has water-soluble properties. In addition, the polysiloxane-based compound according to an embodiment of the present invention may be mixed in a substantially homogeneous form in an aqueous etchant composition including a phosphoric acid.

In Chemical Formula 1, $R^1$ may be amino(C1-C20)alkyl; one of $R^2$ and $R^3$ is amino(C1-C20)alkyl, and the other may be selected from hydroxy, (C1-C20)alkoxy, —OP(=O)(OH)$_2$, and amino(C1-C20)alkyl; one of $R^4$ and $R^5$ may be -L-$SO_3H$, and the other may be selected from hydroxy, (C1-C20)alkoxy, —OP(=O)(OH)$_2$, and -L-$SO_3H$; $R^6$ may be selected from hydrogen, (C1-C20)alkyl, and —P(=O)(OH)$_2$; L may be (C1-C20)alkylene; n and m may be each independently an integer selected from 1 to 90; z may be an integer selected from 1 to 4; and two different repeating units denoted by n and m may be selected from a block form, a random form, and an alternating form, and the like.

In Chemical Formula 1, $R^1$ may be amino (C1-C7)alkyl; one of $R^2$ and $R^3$ is amino(C1-C7)alkyl, and the other may be selected from hydroxy, (C1-C7)alkoxy, —OP(=O)(OH)$_2$, and amino(C1-C7)alkyl; one of $R^4$ and $R^5$ may be -L-$SO_3H$, and the other may be selected from hydroxy, (C1-C7)alkoxy, —OP(=O)(OH)$_2$, and -L-$SO_3H$; $R^6$ may be selected from hydrogen, (C1-C7)alkyl, and —P(=O)(OH)$_2$; L may be (C1-C7)alkylene; n and m may be each independently an integer selected from 2 to 70; z may be an integer selected from 2 to 4; and two different repeating units denoted by n and m may be selected from a block form, a random form, and an alternating form, and the like.

Since $R^1$ to $R^6$ have 7 or less carbon atoms, it may be preferable that the polysiloxane-based compound may be stably included in the aqueous etchant composition and have high water solubility. In addition, since $R^1$ to $R^5$ include hetero elements such as oxygen, sulfur, phosphorus, and nitrogen, and the like, in the substituent, it may be preferable that high polarity may be exhibited, and the polysiloxane-based compound may be selectively interacted with the silicon oxide layer together with excellent water-solubility to protect the silicon oxide layer, thereby exhibiting an excellent etch selectivity ratio with respect to the silicon nitride layer.

In the polysiloxane-based compound according to an embodiment of the present invention, as a specific and non-limiting example, the two different repeating units denoted by n and m may have a range in which a value of n/m is 0.01 to 100, preferably 0.1 to 70, and more preferably 1 to 50. As the two different repeating units are included within the above-described range, the silicon oxide layer may be effectively protected to be capable of etching the silicon nitride layer with a higher selectivity ratio.

In the polysiloxane-based compound according to an embodiment of the present invention, any repeating unit represented by —Si($R^7$)($R^8$)O— may be further included together with two different repeating units denoted by n and m. $R^7$ and $R^8$ may be each independently selected from hydroxy, (C1-C20)alkoxy, halogen, amine, —OP(=O)(OH)$_2$, and (C1-C20)alkyl, and the like. More specifically, the number of repeating units represented by —Si($R^7$)($R^8$)O— in the polysiloxane-based single substituent chain bonded to Si, which is a central element of the polysiloxane-based compound, may be 0 to 20, preferably 0 to 10, and more preferably 0 to 5. However, these numerical values are merely arbitrary elements, and the present invention is not limited to the above-described numerical range. As a non-limiting example, when z is 3, the repeating units represented by —Si($R^7$)($R^8$)O— may be included only in one polysiloxane-based substituent chain and may not be included in remaining two polysiloxane-based substituent chains. However, this is only an example, and thus various modifications are also included in the scope of the present invention.

In an embodiment of the present invention, Chemical Formula 1 may be at least one selected from the following structures:

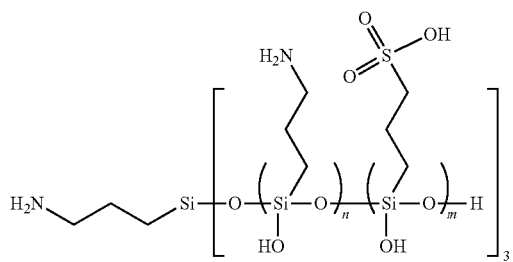

-continued

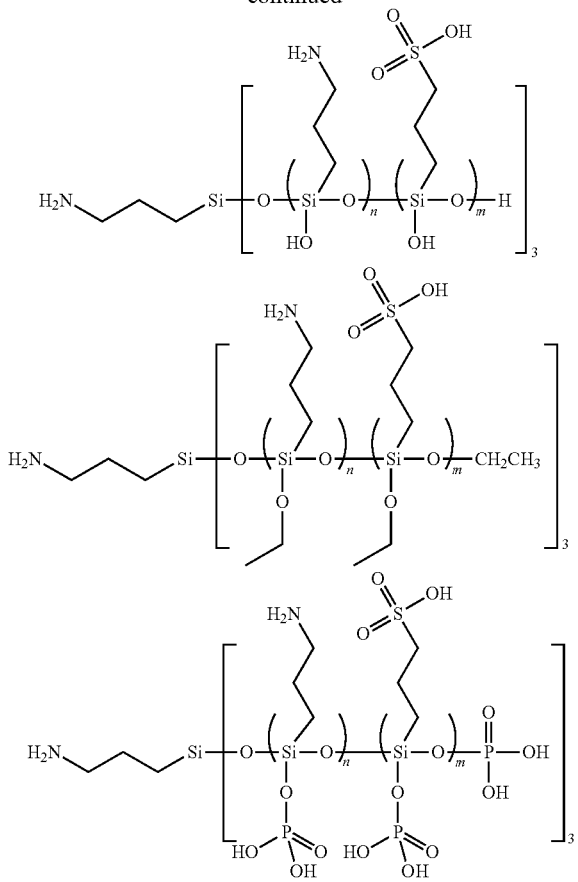

in structures above, n and m are each independently an integer selected from 1 to 100.

Another embodiment of the present invention may be an etching additive including the polysiloxane-based compound represented by Chemical Formula 1 above. The etching additive may exhibit a particularly good etch selectivity ratio with respect to the silicon nitride layer since the etching additive is included in the etchant.

The etch additive imparts a high etch selectivity ratio with respect to the silicon nitride layer due to the Si—O bond and the new Si—O bond formed at the time of the hydrolysis, and reduces abnormal growth of a thickness of the silicon oxide layer, and the like, other than the silicon nitride layer. In addition, the etching additive improves the etch rate of the silicon nitride layer and reduces a change in the etch rate even when an etchant is used several times.

Still another embodiment of the present invention may be a silicon nitride layer etching composition including a polysiloxane-based compound represented by Chemical Formula 1-1 below, a phosphoric acid, water, and the like:

[Chemical Formula 1-1]

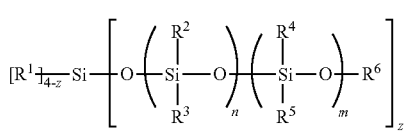

in Chemical Formula 1-1, $R^1$ is selected from hydrogen, hydroxy, (C1-C20)alkoxy, halogen, (C1-C20)alkyl, amino(C1-C20)alkyl, -L-$SO_3$H, —OP(=O)$(OH)_2$, -L-OP(=O)$(OH)_2$, -L-P(=O)$(OH)_2$, -L-P(=O)(OH)$R^{120}$, —OP(=O)(OH)$R^{110}$, and -L-OP(=O)(OH)$R^{100}$;

one of $R^2$ and $R^3$ is amino(C1-C20)alkyl, and the other is selected from hydrogen, hydroxy, (C1-C20)alkoxy, halogen, (C1-C20)alkyl, amino(C1-C20)alkyl, and —OP(=O)$(OH)_2$;

one of $R^4$ and $R^5$ is selected from -L-$SO_3$H, -L-OP(=O)$(OH)_2$, -L-P(=O)$(OH)_2$, -L-P(=O)(OH)$R^{120}$, and -L-OP(=O)(OH)$R^{100}$, and the other is selected from hydrogen, hydroxy, (C1-C20)alkoxy, halogen, —OP(=O)$(OH)_2$, (C1-C20)alkyl, -L-$SO_3$H, -L-OP(=O)$(OH)_2$, -L-P(=O)$(OH)_2$, -L-P(=O)(OH)$R^{120}$, —OP(=O)(OH)$R^{110}$, and -L-OP(=O)(OH)$R^{100}$;

$R^6$ is selected from hydrogen, (C1-C20)alkyl, —OP(=O)$(OH)_2$, —P(=O)$(OH)_2$, and —OP(=O)(OH)$R^{110}$;

$R^{100}$, $R^{110}$, and $R^{120}$ are each independently (C1-C20)alkyl;

L is (C1-C20)alkylene;

n and m are each independently an integer selected from 0 to 100; and satisfy n+m≥1; and z is an integer selected from 1 to 4.

Specifically, the polysiloxane-based compound may be a mixture of a polysiloxane-based compound in which n is an integer of 0 and a polysiloxane-based compound in which m is an integer of 0. More specifically, the mixture may simultaneously include a polysiloxane-based compound represented by Chemical Formula 2 below and a polysiloxane-based compound represented by Chemical Formula 3 below:

[Chemical Formula 2]

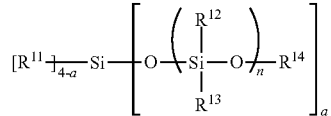

in Chemical Formula 2, $R^{11}$ is selected from hydrogen, hydroxy, (C1-C20)alkoxy, halogen, (C1-C20)alkyl, —OP(=O)$(OH)_2$, and amino(C1-C20)alkyl;

one of $R^{12}$ and $R^{13}$ is amino(C1-C20)alkyl, and the other is selected from hydrogen, hydroxy, (C1-C20)alkoxy, halogen, (C1-C20)alkyl, —OP(=O)$(OH)_2$, and amino(C1-C20)alkyl;

$R^{14}$ is selected from hydrogen, (C1-C20)alkyl, —OP(=O)$(OH)_2$, —P(=O)$(OH)_2$, and —OP(=O)(OH)$R^{110}$;

$R^{110}$ is (C1-C20)alkyl;

n is an integer selected from 1 to 100; and a is an integer selected from 1 to 4, and

[Chemical Formula 3]

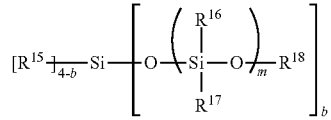

in Chemical Formula 3, $R^{15}$ is selected from hydrogen, hydroxy, (C1-C20)alkoxy, halogen, (C1-C20)alkyl, -L-$SO_3$H, —OP(=O)$(OH)_2$, -L-OP(=O)(OH)$_2$, -L-P(=O)(OH)$_2$, —OP(=O)(OH)R$^{110}$, -L-P(=O)(OH)R$^{120}$, and -L-OP(=O)(OH)R$^{100}$;

one of R$^{16}$ and R$^{17}$ is selected from -L-SO$_3$H, -L-OP(=O)(OH)$_2$, -L-P(=O)(OH)$_2$, -L-P(=O)(OH)R$^{120}$, and -L-OP(=O)(OH)R$^{100}$, and the other is selected from hydrogen, hydroxy, (C1-C20)alkoxy, halogen, (C1-C20)alkyl, -L-SO$_3$H, —OP(=O)(OH)$_2$, -L-OP(=O)(OH)$_2$, -L-P(=O)(OH)$_2$, —OP(=O)(OH)R$^{110}$, -L-P(=O)(OH)R$^{120}$, and -L-OP(=O)(OH)R$^{100}$;

R$^{18}$ is selected from hydrogen, (C1-C20)alkyl, —OP(=O)(OH)$_2$, —P(=O)(OH)$_2$, and —P(=O)(OH)R$^{110}$;

R$^{100}$, R$^{110}$, and R$^{120}$ are each independently (C1-C20)alkyl;

L is (C1-C20)alkylene;

m is an integer selected from 1 to 100; and b is an integer selected from 1 to 4.

In Chemical Formula 2, R$^{11}$ may be selected from hydroxy, (C1-C20)alkyl, and amino(C1-C20)alkyl, one of R$^{12}$ and R$^{13}$ may be amino(C1-C20)alkyl, and the other may be selected from hydroxy, (C1-C7)alkoxy, and amino(C1-C20)alkyl; R$^{14}$ may be selected from hydrogen, (C1-C20)alkyl, and —P(=O)(OH)$_2$, n may be an integer selected from 1 to 50; and a may be an integer selected from 1 to 4.

In addition, in Chemical Formula 3, R$^{15}$ may be hydroxy, (C1-C20)alkyl, and -L-SO$_3$H; one of R$^{16}$ and R$^{17}$ may be -L-SO$_3$H, and the other may be selected from hydroxy, (C1-C20)alkoxy, and -L-SO$_3$H; R$^{18}$ may be selected from hydrogen, and (C1-C20)alkyl; L may be (C1-C20)alkylene; m may be an integer selected from 1 to 50; and b may be an integer selected from 1 to 4.

In Chemical Formula 2, R$^{11}$ may be selected from hydroxy, (C1-C7)alkyl, and amino(C1-C7)alkyl, one of R$^{12}$ and R$^{13}$ may be amino(C1-C7)alkyl, and the other may be selected from hydroxy, (C1-C7)alkoxy, and amino(C1-C7)alkyl; R$^{14}$ may be selected from hydrogen, (C1-C7)alkyl, and —P(=O)(OH)$_2$, n may be an integer selected from 2 to 20; and a may be an integer selected from 2 to 4.

In addition, in Chemical Formula 3, R$^{15}$ may be hydroxy, (C1-C7)alkyl, and -L-SO$_3$H; one of R$^{16}$ and R$^{17}$ may be -L-SO$_3$H, and the other may be selected from hydroxy, (C1-C7)alkoxy, and -L-SO$_3$H; R$^{18}$ may be selected from hydrogen and (C1-C7)alkyl; L may be (C1-C7)alkylene; m may be an integer selected from 2 to 20; and b may be an integer selected from 2 to 4.

The polysiloxane-based compound represented by Chemical Formula 2 and the polysiloxane-based compound represented by Chemical Formula 3 above may be water-soluble and may be stably included in an aqueous silicon nitride-based etching composition since the polysiloxane-based compound has water-soluble properties. In addition, the silicon nitride layer etching composition including the mixture of polysiloxane-based compounds according to an embodiment of the present invention is mixed in a substantially homogeneous form in an aqueous etchant composition including a phosphoric acid, and provides a remarkable synergy as compared to cases where the respective polysiloxane-based compounds are used alone.

Chemical Formula 2 may be at least one selected from the polysiloxane-based compound represented by Structural Formula 1 below, and Chemical Formula 3 may be at least one selected from the polysiloxane-based compound represented by Structural Formula 2 below:

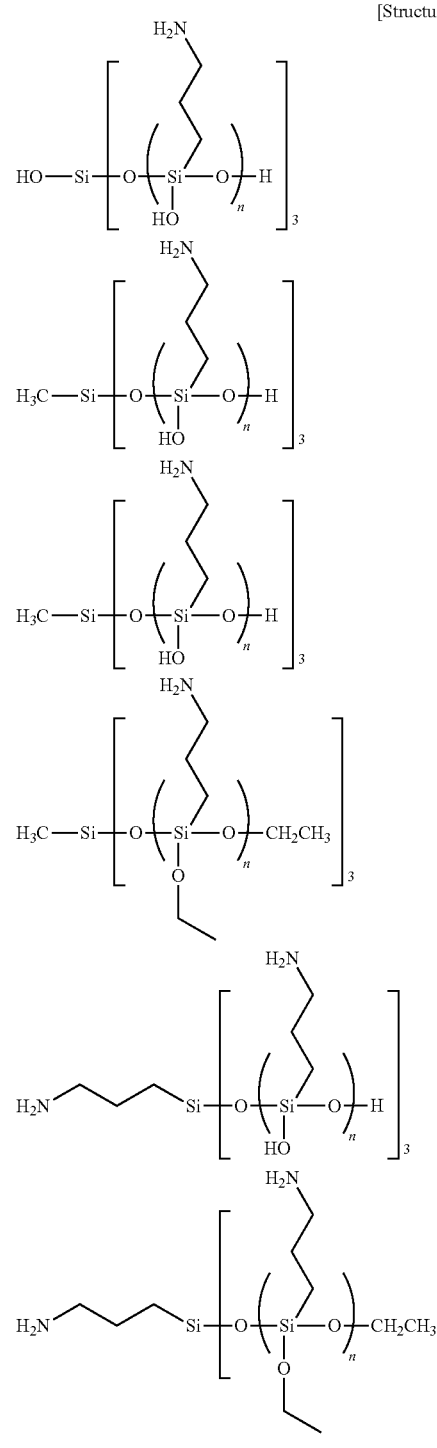

[Structural Formula 1]

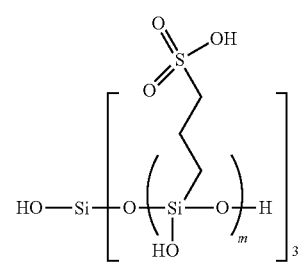

[Structural Formula 2]

-continued

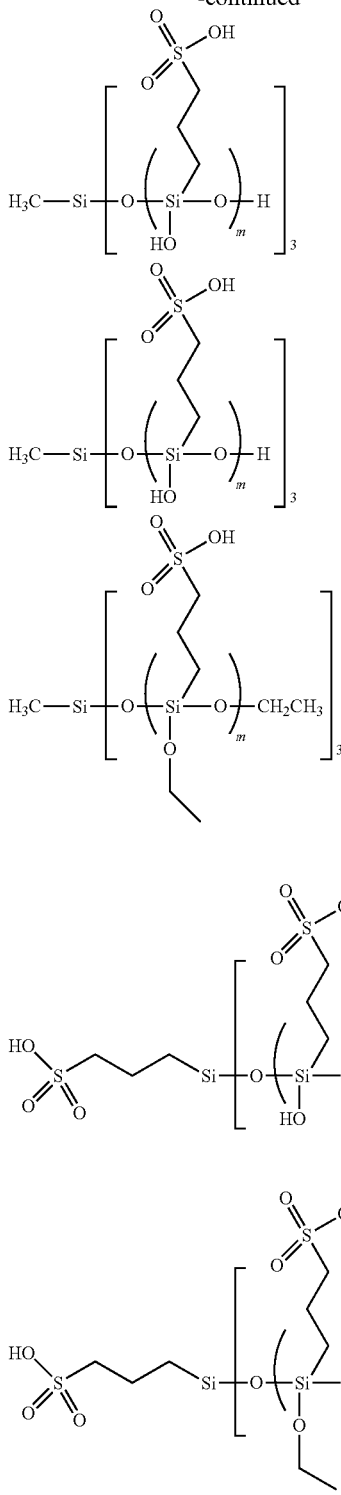

in Structural Formulas 1 and 2,
n and m are each independently an integer selected from 1 to 100.

In the silicon nitride layer etching composition according to an embodiment of the present invention, the mixture of the polysiloxane-based compound represented by Chemical Formula 2 and the polysiloxane-based compound represented by Chemical Formula 3 may include the polysiloxane-based compound represented by Chemical Formula 2 and the polysiloxane-based compound represented by Chemical Formula 3 in a weight ratio (wt:wt) of 1:99 to 99:1. Specifically, the mixture of the polysiloxane-based compound represented by Chemical Formula 2 and the polysiloxane-based compound represented by Chemical Formula 3 may include the polysiloxane-based compound represented by Chemical Formula 2 and the polysiloxane-based compound represented by Chemical Formula 3 in a weight ratio of 40:60 to 99:1, and more specifically, 50:50 to 95:5. As two polysiloxane-based compounds are included within the above-described range, the silicon oxide layer may be effectively protected to be capable of etching the silicon nitride layer with a higher selectivity ratio.

In the mixture of polysiloxane-based compounds according to an embodiment of the present invention, each of the polysiloxane-based compounds represented by Chemical Formulas 2 and 3 may further include any repeating unit represented by —Si($R^9$)($R^{10}$)O—. $R^9$ and $R^{10}$ may be each independently selected from hydroxy, (C1-C20)alkoxy, halogen, amine, —OP(=O)(OH)$_2$, and (C1-C20)alkyl. More specifically, the number of repeating units represented by —Si($R^9$)($R^{10}$)O— in the polysiloxane-based single substituent chain bonded to Si, which is a central element of the polysiloxane-based compound, may be 0 to 20, preferably 0 to 10, and more preferably 0 to 5. However, these numerical values are merely arbitrary elements and are not limited to the above-described numerical range. As a non-limiting example, when a and b are 3, the repeating unit represented by —Si($R^9$)($R^{10}$)O— may be included only in one polysiloxane-based substituent chain and may not be included in remaining two polysiloxane-based substituent chains. However, this is only an example, and thus various modifications are also included in the scope of the present invention.

In Chemical Formula 1-1, n and m may be each independently an integer selected from 1 to 90; $R^1$ may be amino (C1-C20)alkyl; one of $R^2$ and $R^3$ may be amino(C1-C20)alkyl, and the other may be selected from hydroxy, (C1-C20)alkoxy, —OP(=O)(OH)$_2$, and amino(C1-C20)alkyl; one of $R^4$ and $R^5$ may be -L-SO$_3$H, and the other may be selected from hydroxy, (C1-C20)alkoxy, —OP(=O)(OH)$_2$, and -L-SO$_3$H; $R^6$ may be selected from hydrogen, (C1-C20) alkyl, and —P(=O)(OH)$_2$; L may be (C1-C20)alkylene; z may be an integer selected from 1 to 4; and two different repeating units denoted by n and m may be selected from a block form, a random form, and an alternating form, and the like.

In Chemical Formula 1-1, $R^1$ may be amino(C1-C7)alkyl; one of $R^2$ and $R^3$ may be amino(C1-C7)alkyl, and the other may be selected from hydroxy, (C1-C7)alkoxy, —OP(=O)(OH)$_2$, and amino(C1-C7)alkyl; one of $R^4$ and $R^5$ may be -L-SO$_3$H, and the other may be selected from hydroxy, (C1-C7)alkoxy, —OP(=O)(OH)$_2$, and -L-SO$_3$H; $R^6$ may be selected from hydrogen, (C1-C7)alkyl, and —P(=O)(OH)$_2$; L may be (C1-C7)alkylene; n and m may be each independently an integer selected from 2 to 70; z may be 2 to 4; and two different repeating units denoted by n and m may be selected from a block form, a random form, and an alternating form, and the like.

Chemical Formula 1-1 may be at least one or more selected from the polysiloxane-based compound represented by Structural Formula 3 below:

[Structural formula 3]

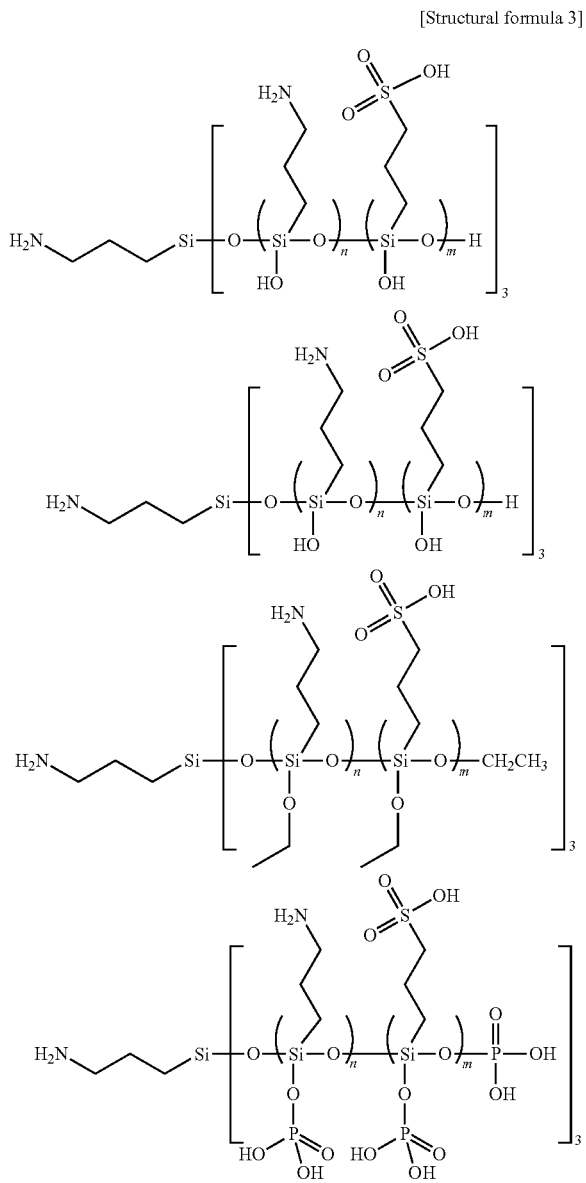

in Structural Formula 3, n and m are each independently an integer selected from 0 to 100, and satisfy n+m≥1.

In an embodiment of the present invention, the silicon nitride layer etching composition may include 0.005 to 10 wt % of the polysiloxane-based compound, 60 to 90 wt % of the phosphoric acid, and a remaining amount of water, based on a total weight of the composition. When the above-described range is satisfied, the precipitates may be remarkably reduced, the abnormal growth of the silicon oxide layer, and the like other than the silicon nitride layer may be more effectively prevented, and the etching composition may have excellent stability during a high temperature semiconductor etching process. For example, when the silicon nitride layer etching composition according to an embodiment of the present invention is used in the etching process, it is preferable since it is possible to etch the silicon nitride layer with high etch selection property, to maintain excellent etch rate and high etch selection property with respect to the silicon nitride layer even after repeating the etching process.

Specifically, the silicon nitride layer etching composition may include 0.005 to 5 wt % of the polysiloxane-based compound, 75 to 90 wt % of the phosphoric acid, and a remaining amount of water, based on a total weight of the composition, and more specifically, may include 0.005 to 3 wt % of the polysiloxane-based compound, 80 to 90 wt % of the phosphoric acid, and a remaining amount of water, based on a total weight of the composition. However, this is merely an embodiment, and the present invention is not limited to the above-described numerical range.

The water is not particularly limited but may be preferably a deionized water. More specifically, the deionized water is a deionized water for a semiconductor process and may have a specific resistance value of 18 MΩ·cm or more, but the present invention is not limited thereto.

The silicon nitride layer etching composition according to an embodiment of the present invention may further include any additive that are typically used in the art. The additive may include any one or two or more selected from a surfactant, an antioxidant, and a corrosion inhibitor, and the like, and various additives may be used in addition to the above-described additives. Here, the additive may be used in an amount of 0.01 to 2 wt % based on the total weight of the silicon nitride layer etching composition, but the amount of the additive is not limited thereto.

In an embodiment of the present invention, the silicon nitride layer etching composition may satisfy an etch selectivity ratio represented by Relational Expression 1 below:

$$500 \leq E_{SiNx}/E_{SiO2} \quad \text{[Relational Expression 1]}$$

in Relational Expression 1, $E_{SiNx}$ is an etch rate of a silicon nitride layer, and $E_{SiO2}$ is an etch rate of a silicon oxide layer.

Specifically, the etch selectivity ratio may satisfy Relational Expression 1-1 below, and more specifically, may satisfy Relational Expression 1-2 below:

$$1{,}000 \leq E_{SiNx}/E_{SiO2} \leq 10{,}000 \quad \text{[Relational Expression 1-1]}$$

$$1{,}000 \leq E_{SiNx}/E_{SiO2} \leq 7{,}000 \quad \text{[Relational Expression 1-2]}$$

in Relational Expressions 1-1 and 1-2 above, $E_{SiNx}/E_{SiO2}$ follows the definition of Relational Expression 1 above.

In an embodiment of the present invention, an etch rate drift of the silicon nitride layer etching composition after repeating an etching process may satisfy Relational Expression 2 below:

$$\Delta ERD_{SiNx} \leq 1\% \quad \text{[Relational Expression 2]}$$

in Relational Expression 2, $\Delta ERD_{SiNx}$ is an etch rate drift relative to an initial etch rate with respect to the silicon nitride layer.

When Relational Expression 2 is satisfied, a high etch selectivity ratio and an etch rate may be maintained when the silicon nitride layer etching composition is repeatedly used, thereby achieving excellent process efficiency.

Specifically, the etch rate drift may satisfy Relational Expression 2-1 below, and more specifically, may satisfy Relational Expression 2-2 below:

$$\Delta ERD_{SiNx} \leq 0.8\% \quad \text{[Relational Expression 2-1]}$$

$$\Delta ERD_{SiNx} \leq 0.6\% \quad \text{[Relational Expression 2-2]}$$

in Relational Expressions 2-1 and 2-2 above, $\Delta ERD_{SiNx}$ follows the definition of Relational Expression 2 above.

Specifically, the etch rate drift ΔERD is calculated by Equation 1 below: In Equation 1 below, n is a natural number of 2 or more:

ΔERD (%)=[1−{(etch rate when silicon nitride layer etching composition is used n times or more)/(etch rate when silicon nitride layer etching composition is used once)}]×100   [Equation 1]

In an embodiment of the present invention, the silicon nitride layer etching composition may further include an alcohol-based solvent. The alcohol-based solvent may be included in an amount of 0.05 to 10 wt %, specifically 0.05 to 5 wt %, and more specifically 0.05 to 3 wt %, based on the total weight of the silicon nitride layer etching composition. When the above-described range is satisfied, it is possible to obtain a stable effect even at a high temperature of a semiconductor manufacturing process by controlling a viscosity of the silicon nitride layer etching composition. Further, even when the silicon nitride layer etching composition is used several times, the change rate of the etch rate with respect to the silicon nitride layer is low, and thus the process efficiency is good.

The alcohol-based solvent may be, for example, one or a mixture of two or more selected from the group consisting of methanol, ethanol, propanol, isopropanol, butanol, isobutanol, t-butanol, pentanol, hexanol, heptanol, octanol, tetrahydrofurfuryl alcohol (THFA), and the like, but the invention is not limited thereto.

In an embodiment of the present invention, the silicon nitride layer etching composition may further include an ammonium-based compound based on the total weight of the silicon nitride layer etching composition. The ammonium-based compound may be included in an amount of 0.05 to 1 wt % based on the total weight of the silicon nitride layer etching composition. When the ammonium-based compound is added, the lowering of the etch rate and the change of the selectivity ratio may be small and the etch rate may be constantly maintained even when the composition is used for a long period of time.

The ammonium-based compound may be, for example, one or a mixture of two or more selected from ammonia water, ammonium chloride, ammonium acetic acid, ammonium phosphate, ammonium peroxydisulfate, ammonium sulfate, and ammonium fluoride, and the like, but the invention is not limited thereto.

In an embodiment of the present invention, the silicon nitride layer etching composition may further include a fluorine-based compound. The fluorine-based compound may have an amount of 0.001 to 2 wt % based on the total weight of the etching composition. When the fluorine-based compound is added, the etch rate of the silicon nitride layer may increase. Despite repeated use, the change in etch rate and the change in etch selectivity ratio with respect to the silicon nitride layer may be small.

The fluorine-based compound may be, for example, one or a mixture of two or more selected from hydrogen fluoride, ammonium fluoride, ammonium bifluoride, and tetrafluoroboric acid, and the like, but the invention is not limited thereto.

Since the silicon nitride layer etching composition according to an embodiment of the present invention includes the above-described compound, when the above-described silicon nitride layer and silicon oxide layer are mixed, only the silicon nitride layer may be selectively etched with respect to the silicon oxide layer, the etch rate may be fast, and the abnormal growth may not be generated in the layer other than the silicon nitride layer after etching, thus minimizing a problem of defects in manufacturing the semiconductor device.

Further, the silicon nitride layer etching composition according to embodiments of the present invention has high temperature stability, thereby effectively suppressing phenomenon in which the silicon oxide layer is etched by the phosphoric acid heated at a high temperature. Therefore, the abnormal growth of the silicon oxide layer may not be generated, thereby preventing substrate defects, and the silicon nitride layer may be selectively etched to implement excellent semiconductor device characteristics.

In still another embodiment of the present invention, there is also provided a method of selectively etching the silicon nitride layer relative to the silicon oxide layer using the above-described silicon nitride layer etching composition. Here, the etching method may be performed according to a method commonly used in the art, and may be performed, for example, by an immersion method, a spray method, or the like. Here, the etching method may be performed at a process temperature of 100° C. or more, preferably, at a process temperature of 100 to 500° C. and more preferably, 100 to 300° C. The proper temperature may be varied as necessary in consideration of other processes and other factors.

Here, the silicon oxide layer, the silicon nitride layer, and a photoresist layer, and the like, formed on a substrate, may each be formed of a single layer, a double layer or multiple layers (multilayer). When the silicon oxide layer, the silicon nitride layer, or the photoresist layer is the double layer or the multiple layers, the stacking order is not limited.

In addition, the substrate may be formed of various materials such as silicon, quartz, glass, silicon wafer, polymer, metal, and metal oxide, and the like, but the material of the substrate is not limited thereto. As an example of the polymer substrate, a film substrate such as polyethylene terephthalate, polycarbonate, polyimide, polyethylene naphthalate, cycloolefin polymer, or the like, may be used, but the substrate is not limited thereto.

The silicon nitride layer etching composition according to embodiments of the present invention may also be used in a method of manufacturing a semiconductor device. Specifically, according to the method of manufacturing a semiconductor device using the silicon nitride layer etching composition according to embodiments of the present invention, it is possible to selectively etch the silicon nitride layer in the semiconductor device in which the silicon nitride layer and the silicon oxide layer are alternately stacked or mixed, to effectively suppress damage to the silicon oxide layer, thereby minimizing damage to the silicon oxide layer by etching, and thus it is possible to greatly improve stability, efficiency, and reliability of the semiconductor device manufacturing process. Here, the kind of the semiconductor device is not particularly limited in the present invention.

Hereinafter, the present invention is described in detail on the basis of Examples and Comparative Examples. Meanwhile, the following Examples and Comparative Examples are provided by way of example for explaining the present invention in more detail, and therefore, the present invention is not limited thereto. Unless otherwise stated in the present disclosure, all of the temperatures are expressed in the unit of ° C., and the amount of composition used is expressed in the unit of wt %.

[Method of Measuring Physical Properties]
1) Measurement of Etch Rate

Specifically, a silicon nitride layer (SiN layer) wafer and a silicon oxide layer wafer were respectively prepared in the same manner as in the semiconductor manufacturing process by chemical vapor deposition (CVD). As the silicon oxide layer wafer, a plasma enhanced tetra ethyl ortho silicate (PETEOS) layer was used.

A thickness of the composition before etching was measured using an Ellipsometer (M-2000U manufactured by J. A WOOLLAM) as a thin layer thickness measuring apparatus. The wafer was immersed in a composition maintained at an etch temperature of 163° C. in a quartz bath for 10 minutes to conduct the etching process. After the etching was completed, the composition was cleaned with ultrapure water, then the residual etchant and moisture were thoroughly dried using a drying apparatus, and the etch rate was measured.

The etch rate was calculated by dividing a difference between a thickness before etching and a thickness after etching using the Ellipsometer (M-2000U manufactured by JA WOOLLAM) by the etch time (minute).

2) Measurement of Etch Rate Drift

The silicon nitride layer etch rate of the composition was measured by the etch rate measurement method.

The etch rate drift was measured by performing etching on 10 batches, i.e., by repeating this etching process (defined as 1 batch) 10 times without changing the silicon nitride layer etching composition.

The etch rate drift ($\Delta ERD$ (%)) was calculated by Equation 1 below.

$\Delta ERD$ (%)=[1−{(etch rate when silicon nitride layer etching composition is used 10 times)/(etch rate when silicon nitride layer etching composition is used once)}]×100    [Equation 1]

Example 1

[Chemical Formula 1]

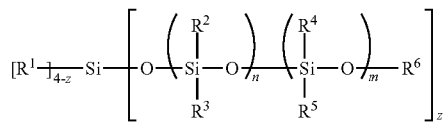

In order to prepare a polysiloxane-based compound in which $R^1$ and $R^2$ are aminopropyl, $R^3$ is hydroxy, $R^4$ is —$(CH_2)_3$—$SO_3H$, $R^5$ is hydroxy, $R^6$ is hydrogen, n is 3, m is 3, z is 3, and the repeating unit has a random form in Chemical Formula 1 above, in a flask equipped with a cooling tube and a stirrer, triethoxysilane was added, and then allylamine was added in a molar ratio of 1:1 with triethoxysilane. Ethyl acetate as a solvent was added in an amount of 500 parts by weight based on 100 parts by weight of triethoxysilane. The reaction mixture was heated to 50° C. and then Karstedt's catalyst was added in an amount of 0.004 parts by weight based on 100 parts by weight of triethoxysilane. The reaction mixture was subjected to hydrosilylation at 80° C. for 3 hours, and ethyl acetate was removed to obtain a synthetic intermediate 1.

A synthetic intermediate 2 was obtained in the same manner as described above except that allyl chloride was used instead of allylamine, and after the hydrosilylation, sodium sulfite was added in an amount of 2 equivalents of allyl chloride together with a small amount of water, the reaction mixture was stirred for 15 hours, and ethyl acetate was removed. With respect to 100 parts by weight of water as a solvent, 40 parts by weight of synthetic intermediates 1 and 2 were reacted at a 1:1 molar ratio. Here, the synthetic intermediates were added dropwise at a rate of 3 mL/min to the solvent stirred at 60° C. and 500 rpm, and then stirred for 1 hour while maintaining the temperature.

The elemental analyzer (EA) results showed a structure of a compound in which each mass ratio of elements was as follows: C=24.36%, H=5.31%, N=4.16%, O=36.73%, S=11.25%, and Si=18.19%.

Example 2

In order to prepare a polysiloxane-based compound in which $R^1$ is aminopropyl, $R^2$ is aminopropyl, $R^3$ is hydroxy, $R^4$ is —$(CH_2)_3$—$SO_3H$, $R^5$ is hydroxy, $R^6$ is hydrogen, n is 60, m is 3, z is 3, and the repeating unit has a random form in Chemical Formula 1 above, Example 2 was performed in the same manner as in Example 1 except that the synthesis intermediates 1 and 2 were stirred at a molar ratio of 20:1 for 3 hours.

The elemental analyzer (EA) results showed a structure of a compound in which each mass ratio of elements was as follows: C=30.85%, H=7.14%, N=11.81%, O=27.91%, S=1.89%, and Si=20.40%.

Example 3

In order to prepare a polysiloxane-based compound in which $R^1$ is aminopropyl, $R^2$ is aminopropyl, $R^3$ is ethoxy, $R^4$ is —$(CH_2)_3$—$SO_3H$, $R^5$ is ethoxy, $R^6$ is ethyl, n is 60, m is 3, z is 3, and the repeating unit has a random form in Chemical Formula 1 above, Example 3 was performed in the same manner as in Example 2 except that a solvent in which 1 part by weight of water was mixed with respect to 100 parts by weight of ethanol was used instead of 100 parts by weight of water as a solvent.

The elemental analyzer (EA) results showed a structure of a compound in which each mass ratio of elements was as follows: C=41.15%, H=7.89%, N=8.45%, O=23.81%, S=1.31%, and Si=17.39%.

Example 4

In order to prepare a polysiloxane-based compound in which $R^1$ is aminopropyl, $R^2$ is aminopropyl, $R^3$ is —OP(=O)(OH)$_2$, $R^4$ is —$(CH_2)_3$—$SO_3H$, $R^5$ is —OP(=O)(OH)$_2$, $R^6$ is —P(=O)(OH)$_2$, n is 60, m is 3, z is 3, and the repeating unit has a random form in Chemical Formula 1 above, Example 4 was performed in the same manner as in Example 2 except that a solvent in which 15 parts by weight of water was mixed with respect to 100 parts by weight of phosphoric acid was used instead of 100 parts by weight of water as a solvent and the reaction temperature was changed to 12° C.

The elemental analyzer (EA) results showed a structure of a compound in which each mass ratio of elements was as follows: C=16.78%, H=5.17%, N=6.87%, O=40.88%, P=16.89%, S=1.02%, and Si=12.39%.

Preparation Example 1

[Chemical Formula 2]

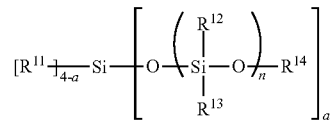

In order to prepare a polysiloxane-based compound in which $R^{11}$ is hydroxy, $R^{12}$ is aminopropyl, $R^{13}$ is hydroxy, $R^{14}$ is hydrogen, n is 3, and a is 3 in Chemical Formula 2 above, in a flask equipped with a cooling tube and a stirrer, triethoxysilane was added, and then allylamine was added in a molar ratio of 1:1 with triethoxysilane. Ethyl acetate as a solvent was added in an amount of 500 parts by weight based on 100 parts by weight of triethoxysilane.

The reaction mixture was heated to 50° C. and then Karstedt's catalyst was added in an amount of 0.004 parts by weight based on 100 parts by weight of triethoxysilane. The reaction mixture was subjected to hydrosilylation at 80° C. for 3 hours, and ethyl acetate was removed to obtain a synthetic intermediate 1.

40 parts by weight of the synthetic intermediate was added with respect to 100 parts by weight of water as a solvent, and the reaction mixture was stirred at 60° C. and 500 rpm for 1 hour. Thereafter, tetraethylorthosilicate was added dropwise at a rate of 3 mL/min in an amount of ⅓ mol of triethoxysilane while stirring was maintained at 30° C.

The elemental analyzer (EA) results showed a structure of a compound in which each mass ratio of elements was as follows: C=27.85%, H=6.96% N=11.51%, O=29.39%, and Si=24.29%.

Preparation Example 2

In order to prepare a polysiloxane-based compound in which $R^{11}$ is methyl, $R^{12}$ is aminopropyl, $R^{13}$ is hydroxy, $R^{14}$ is hydrogen, n is 3, and a is 3 in Chemical Formula 2 above, Preparation Example 2 was performed in the same manner as in Preparation Example 1 above except that triethoxymethylsilane was used instead of tetraethylorthosilicate.

The elemental analyzer (EA) results showed a structure of a compound in which each mass ratio of elements was as follows: C=29.61%, H=8.27%, N=10.93%, O=27.65%, and Si=23.54%.

Preparation Example 3

In order to prepare a polysiloxane-based compound in which $R^{11}$ is methyl, $R^{12}$ is aminopropyl, $R^{13}$ is hydroxy, $R^{14}$ is hydrogen, n is 10, and a is 3 in Chemical Formula 2 above, Preparation Example 3 was performed in the same manner as in Preparation Example 1 above except that the reaction mixture was stirred at 60° C. and 500 rpm for 3 hours instead of stirring at 60° C. and 500 rpm for 1 hour.

The elemental analyzer (EA) results showed a structure of a compound in which each mass ratio of elements was as follows: C=28.78%, H=8.15%, N=10.35%, O=26.89%, and Si=25.83%.

Preparation Example 4

In order to prepare a polysiloxane-based compound in which $R^{11}$ is methyl, $R^{12}$ is aminopropyl, $R^{13}$ is ethoxy, $R^{14}$ is ethyl, n is 10, and a is 3 in Chemical Formula 2 above, Preparation Example 4 was performed in the same manner as in Preparation Example 1 above except that a solvent in which 1 part by weight of water was mixed with respect to 100 parts by weight of ethanol was used instead of 100 parts by weight of water as a solvent.

The elemental analyzer (EA) results showed a structure of a compound in which each mass ratio of elements was as follows: C=40.87%, H=8.04%, N=10.12%, O=22.87%, and Si=18.10%.

Preparation Example 5

In order to prepare a polysiloxane-based compound in which $R^{11}$ is aminopropyl, $R^{12}$ is aminopropyl, $R^{13}$ is hydroxy, $R^{14}$ is hydrogen, n is 10, and a is 3 in Chemical Formula 2 above, Preparation Example 5 was performed in the same manner as in Preparation Example 1 above except that the addition of triethoxymethylsilane was omitted.

The elemental analyzer (EA) results showed a structure of a compound in which each mass ratio of elements was as follows: C=30.01%, H=8.11%, N=12.15%, O=27.10%, and Si=22.63%.

Preparation Example 6

In order to prepare a polysiloxane-based compound in which $R^{11}$ is aminopropyl, $R^{12}$ is aminopropyl, $R^{13}$ is ethoxy, $R^{14}$ is ethyl, n is 10, and a is 3 in Chemical Formula 2 above, Preparation Example 6 was performed in the same manner as in Preparation Example 1 above except that a solvent in which 1 part by weight of water was mixed with respect to 100 parts by weight of ethanol was used instead of 100 parts by weight of water as a solvent.

The elemental analyzer (EA) results showed a structure of a compound in which each mass ratio of elements was as follows: C=40.37%, H=9.30%, N=10.01%, O=20.85%, and Si=19.47%.

Preparation Example 7

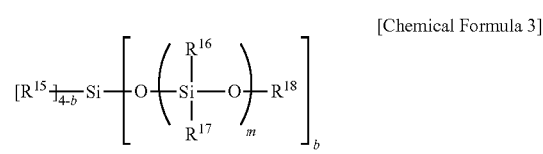

[Chemical Formula 3]

In order to prepare a polysiloxane-based compound in which $R^{15}$ is hydroxy, $R^{16}$ is —$(CH_2)_3$—$SO_3H$, $R^{17}$ is hydroxy, $R^{18}$ is hydrogen, m is 3, and b is 3 in Chemical Formula 3 above, in a flask equipped with a cooling tube and a stirrer, triethoxysilane was added, and then allyl chloride was added in a molar ratio of 1:1 with triethoxysilane. Ethyl acetate as a solvent was added in an amount of 500 parts by weight based on 100 parts by weight of triethoxysilane.

The reaction mixture was heated to 50° C. and then 0.004 parts by weight of Karstedt's catalyst was added. The reaction mixture was subjected to hydrosilylation at 80° C. for 3 hours. Subsequently, sodium sulfite was added in an amount of 2 equivalents of allyl chloride together with a small amount of water at room temperature, the reaction mixture was stirred for 15 hours, and ethyl acetate was removed to obtain a synthetic intermediate.

40 parts by weight of the synthetic intermediate was added with respect to 100 parts by weight of water as a solvent, and the reaction mixture was stirred at 60° C. and 500 rpm for 1 hour. Thereafter, tetraethylorthosilicate was added dropwise at a rate of 3 mL/min in an amount of ⅓ mol of triethoxysilane while stirring was maintained at 30° C.

The elemental analyzer (EA) results showed a structure of a compound in which each mass ratio of elements was as follows: C=19.11%, H=4.89%, O=45.87%, S=15.79%, and Si=14.34%.

Preparation Example 8

In order to prepare a polysiloxane-based compound in which $R^{15}$ is methyl, $R^{16}$ is —$(CH_2)_3$—$SO_3H$, $R^{17}$ is hydroxy, $R^{18}$ is hydrogen, m is 3, and b is 3 in Chemical Formula 3 above, Preparation Example 8 was performed in the same manner as in Preparation Example 7 above except that triethoxymethylsilane was used instead of tetraethylorthosilicate.

The elemental analyzer (EA) results showed a structure of a compound in which each mass ratio of elements was as follows: C=20.11%, H=5.85%, O=44.78%, S=14.87%, and Si=14.39%.

Preparation Example 9

In order to prepare a polysiloxane-based compound in which $R^{15}$ is methyl, $R^{16}$ is —$(CH_2)_3$—$SO_3H$, $R^{17}$ is hydroxy, $R^{18}$ is hydrogen, m is 10, and b is 3 in Chemical Formula 3 above, Preparation Example 9 was performed in the same manner as in Preparation Example 7 above except that the reaction mixture was stirred at 60° C. and 500 rpm for 3 hours instead of stirring at 60° C. and 500 rpm for 1 hour.

The elemental analyzer (EA) results showed a structure of a compound in which each mass ratio of elements was as follows: C=20.85%, H=4.93%, O=42.51%, S=15.84%, and Si=15.87%.

Preparation Example 10

In order to prepare a polysiloxane-based compound in which $R^{15}$ is methyl, $R^{16}$ is —$(CH_2)_3$—$SO_3H$, $R^{17}$ is ethoxy, $R^{18}$ is ethyl, m is 10, and b is 3 in Chemical Formula 3 above, Preparation Example 10 was performed in the same manner as in Preparation Example 7 above except that a solvent in which 1 part by weight of water was mixed with respect to 100 parts by weight of ethanol was used instead of 100 parts by weight of water as a solvent.

The elemental analyzer (EA) results showed a structure of a compound in which each mass ratio of elements was as follows: C=29.51%, H=4.93%, O=38.14%, S=13.96%, and Si=13.46%.

Preparation Example 11

In order to prepare a polysiloxane-based compound in which $R^{15}$ is —$(CH_2)_3$—$SO_3H$, $R^{16}$ is —$(CH_2)_3$—$SO_3H$, $R^{17}$ is hydroxy, $R^{18}$ is hydrogen, m is 10, and b is 3 in Chemical Formula 3 above, Preparation Example 11 was performed in the same manner as in Preparation Example 7 above except that the addition of triethoxymethylsilane was omitted.

The elemental analyzer (EA) results showed a structure of a compound in which each mass ratio of elements was as follows: C=20.31%, H=4.89%, O=44.10%, S=16.46%, Si=14.24%.

Preparation Example 12

In order to prepare a polysiloxane-based compound in which $R^{15}$ is —$(CH_2)_3$—$SO_3H$, $R^{16}$ is —$(CH_2)_3$—$SO_3H$, $R^{17}$ is ethoxy, $R^{18}$ is ethyl, m is 10, and b is 3 in Chemical Formula 3 above, Preparation Example 12 was performed in the same manner as in Preparation Example 7 above except that a solvent in which 1 part by weight of water was mixed with respect to 100 parts by weight of ethanol was used instead of 100 parts by weight of water as a solvent.

The elemental analyzer (EA) results showed a structure of a compound in which each mass ratio of elements was as follows: C=27.46%, H=6.24%, O=36.97%, S=15.23%, and Si=14.10%.

Examples 5 to 11 and Comparative Examples 1 to 4

As shown in Table 1 below, respective silicon nitride layer etching compositions were prepared by mixing components in amounts as shown in Table 1 below and stirring mixtures at room temperature (23° C.) for 5 minutes at 500 rpm.

In addition, physical properties of the respective silicon nitride layer etching compositions were measured and shown in Tables 3 and 4 below.

TABLE 1

| | Phosphoric acid (wt %) | Polysiloxane-based compound represented by Chemical Formula 1 | | Other additives | | Water (wt %) |
|---|---|---|---|---|---|---|
| | | Component | Amount (wt %) | Component | Amount (wt %) | |
| Example 5 | 85.00 | A-1 | 0.10 | — | — | 14.90 |
| Example 6 | 85.00 | A-1 | 0.20 | — | — | 14.80 |
| Example 7 | 85.00 | A-2 | 0.10 | — | — | 14.90 |
| Example 8 | 85.00 | A-3 | 0.10 | — | — | 14.90 |
| Example 9 | 85.00 | A-4 | 0.10 | — | — | 14.90 |
| Example 10 | 85.00 | A-1 | 0.50 | D-1 | 0.20 | 14.30 |
| Example 11 | 85.00 | A-2 | 1.46 | E-1 | 0.04 | 13.50 |
| Comparative Example 1 | 85.00 | — | — | — | — | 15.00 |
| Comparative Example 2 | 85.00 | — | — | B-1 | 0.10 | 14.90 |
| Comparative Example 3 | 85.00 | — | — | B-2 | 0.10 | 14.90 |
| Comparative Example 4 | 85.00 | — | — | B-3 | 0.10 | 14.90 |

Polysiloxane-based compound represented by Chemical Formula 1
A-1: $R^1$ = aminopropyl, $R^2$ = aminopropyl, $R^3$ = hydroxy, $R^4$ = ($CH_2)_3$ $SO_3H$, $R^5$ = hydroxy, $R^6$ = hydrogen, n = 3, m = 3, z = 3, and repeating unit has a random form: Example 1
A-2: $R^1$ = aminopropyl, $R^2$ = aminopropyl, $R^3$ = hydroxy, $R^4$ = ($CH_2)_3$ $SO_3H$, $R^5$ = hydroxy, $R^6$ = hydrogen, n = 60, m = 3, z = 3, and repeating unit has a random form: Example 2
A-3: $R^1$ = aminopropyl, $R^2$ = aminopropyl, $R^3$ = ethoxy, $R^4$ = ($CH_2)_3$ $SO_3H$, $R^5$ = ethoxy, $R^6$ = ethyl, n = 60, m = 3, z = 3, and repeating unit has a random form: Example 3
A-4: $R^1$ = aminopropyl, $R^2$ = aminopropyl, $R^3$ = OP(=O) $(OH)_2$, $R^4$ = ($CH_2)_3$ $SO_3H$, $R^5$ = OP(=O) $(OH)_2$, $R^6$ = P(=O) $(OH)_2$, n = 60, m = 3, z = 3, and repeating unit has a random form: Example 4
[Other additives]
B-1: tetraethylorthosilicate)
B-2: 3-aminopropylsilantriol)
B-3: 3-trihydroxysilyl-1-propanesulfonic acid
D-1: ethanol
E-1: ammonium fluoride Examples 12 to 21 and Comparative Examples 5 to 10

As shown in Table 2 below, respective silicon nitride layer etching compositions were prepared by mixing components in amounts as shown in Table 2 below and stirring mixtures at room temperature (23° C.) for 5 minutes at 500 rpm.

In addition, physical properties of the respective silicon nitride layer etching compositions were measured and shown in Tables 5 and 6 below.

TABLE 2

| | Phosphoric acid (wt %) | Polysiloxane-based compound represented by Chemical Formula 2 Component | Amount (wt %) | Polysiloxane-based compound represented by Chemical Formula 3 Component | Amount (wt %) | Other additives Component | Amount (wt %) | Water (wt %) |
|---|---|---|---|---|---|---|---|---|
| Example 12 | 85.00 | A-1' | 0.10 | B-1 | 0.10 | — | — | 14.80 |
| Example 13 | 85.00 | A-2' | 0.10 | B-2 | 0.10 | — | — | 14.80 |
| Example 14 | 85.00 | A-3' | 0.10 | B-3 | 0.10 | — | — | 14.80 |
| Example 15 | 85.00 | A-4' | 0.10 | B-4 | 0.10 | — | — | 14.80 |
| Example 16 | 85.00 | A-5' | 0.10 | B-5 | 0.10 | — | — | 14.80 |
| Example 17 | 85.00 | A-5' | 0.50 | B-5 | 0.10 | — | — | 14.40 |
| Example 18 | 85.00 | A-5' | 1.00 | B-5 | 0.10 | — | — | 13.90 |
| Example 19 | 85.00 | A-6' | 0.10 | B-6 | 0.10 | — | — | 14.80 |
| Example 20 | 85.00 | A-1' | 0.10 | B-5 | 0.10 | — | — | 14.80 |
| Example 21 | 85.00 | A-5' | 1.30 | B-5 | 0.05 | D-1 | 0.04 | 13.61 |
| Comparative Example 5 | 85.00 | — | — | — | — | — | — | 15.00 |
| Comparative Example 6 | 85.00 | — | — | — | — | C-1 | 0.10 | 14.90 |
| Comparative Example 7 | 85.00 | — | — | — | — | C-2 | 0.10 | 14.90 |
| Comparative Example 8 | 85.00 | — | — | — | — | C-3 | 0.10 | 14.90 |
| Comparative Example 9 | 85.00 | A-1' | 0.10 | — | — | — | — | 14.90 |
| Comparative Example 10 | 85.00 | — | — | B-1 | 0.10 | — | — | 14.90 |

Polysiloxane-based compound represented by Chemical Formula 2
A-1': $R^{11}$ = hydroxy, $R^{12}$ = aminopropyl, $R^{13}$ = hydroxy, $R^{14}$ = hydrogen, n = 3, and a = 3: Preparation Example 1
A-2': $R^{11}$ = methyl, $R^{12}$ = aminopropyl, $R^{13}$ = hydroxy, $R^{14}$ = hydrogen, n = 3, and a = 3: Preparation Example 2
A-3': $R^{11}$ = methyl, $R^{12}$ = aminopropyl, $R^{13}$ = hydroxy, $R^{14}$ = hydrogen, n = 10, and a = 3: Preparation Example 3
A-4': $R^{11}$ = methyl, $R^{12}$ = aminopropyl, $R^{13}$ = ethoxy, $R^{14}$ = ethyl, n = 10, and a = 3: Preparation Example 4
A-5': $R^{11}$ = aminopropyl, $R^{12}$ = aminopropyl, $R^{13}$ = hydroxy, $R^{14}$ = hydrogen, n = 10, and a = 3: Preparation Example 5
A-6': $R^{11}$ = aminopropyl, $R^{12}$ = aminopropyl, $R^{13}$ = ethoxy, $R^{14}$ = ethyl, n = 10, and a = 3: Preparation Example 6

Polysiloxane-based compound represented by Chemical Formula 3
B-1: $R^{15}$ = hydroxy, $R^{16}$ = $(CH_2)_3 SO_3H$, $R^{17}$ = hydroxy, $R^{18}$ = hydrogen, m = 3, and b = 3: Preparation Example 7
B-2: $R^{15}$ = methyl, $R^{16}$ = $(CH_2)_3 SO_3H$, $R^{17}$ = hydroxy, $R^{18}$ = hydrogen, m = 3, and b = 3: Preparation Example 8
B-3: $R^{15}$ = methyl, $R^{16}$ = $(CH_2)_3 SO_3H$, $R^{17}$ = hydroxy, $R^{18}$ = hydrogen, m = 10, and b = 3: Preparation Example 9
B-4: $R^{15}$ = methyl, $R^{16}$ = $(CH_2)_3 SO3H$, $R^{17}$ = ethoxy, $R^{18}$ = ethyl, m = 10, and b = 3: Preparation Example 10
B-5: $R^{15}$ = $(CH_2)_3 SO_3H$, $R^{16}$ = $(CH_2)_3 SO_3H$, $R^{17}$ = hydroxy, $R^{18}$ = hydrogen, m = 10, and b = 3: Preparation Example 11
B-6: $R^{15}$ = $(CH_2)_3 SO_3H$, $R^{16}$ = $(CH_2)_3 SO_3H$, $R^{17}$ = ethoxy, $R^{18}$ = ethyl, m = 10, and b = 3: Preparation Example 12

[Other additives]
C-1: tetraethylorthosilicate
C-2: 3-aminopropylsilantriol
C-3: 3-trihydroxysilyl-1-propanesulfonic acid
D-1: ammonium fluoride

TABLE 3

| | Etch rate (Å/min) | | |
| --- | --- | --- | --- |
| | Nitride layer ($E_{SiNx}$) | Oxide layer ($E_{SiO2}$) | Selectivity ratio ($E_{SiNx}/E_{SiO2}$) |
| Example 5 | 166.30 | 0.11 | 1512 |
| Example 6 | 164.40 | 0.08 | 2055 |
| Example 7 | 164.20 | 0.04 | 4105 |
| Example 8 | 163.30 | 0.04 | 4083 |
| Example 9 | 162.70 | 0.03 | 5423 |
| Example 10 | 165.60 | 0.08 | 2070 |
| Example 11 | 247.20 | 0.06 | 4120 |
| Comparative Example 1 | 170.20 | 2.98 | 57 |
| Comparative Example 2 | 166.00 | 0.32 | 479 |
| Comparative Example 3 | 165.30 | 1.94 | 86 |
| Comparative Example 4 | 165.30 | 0.86 | 188 |

TABLE 4

| | Number of batches | Nitride layer etch rate (Å/min) | Nitride layer etch rate drift (%) | Generation level (Å) of oxide layer abnormal growth |
| --- | --- | --- | --- | --- |
| Example 5 | 1 | 166.30 | — | 0 |
| | 10 | 165.60 | 0.42 | 0 |
| Example 6 | 1 | 164.40 | — | 0 |
| | 10 | 163.90 | 0.30 | 0 |
| Example 7 | 1 | 164.20 | — | 0 |
| | 10 | 163.80 | 0.24 | 0 |
| Example 8 | 1 | 163.30 | — | 0 |
| | 10 | 162.90 | 0.24 | 0 |
| Example 9 | 1 | 162.70 | — | 0 |
| | 10 | 162.40 | 0.18 | 0 |
| Example 10 | 1 | 165.60 | — | 0 |
| | 10 | 165.10 | 0.30 | 0 |
| Example 11 | 1 | 247.20 | — | 0 |
| | 10 | 246.70 | 0.20 | 0 |
| Comparative Example 1 | 1 | 170.10 | — | 0 |
| | 10 | 160.90 | 5.41 | 50 |
| Comparative Example 2 | 1 | 158.20 | — | 0 |
| | 10 | 149.50 | 5.50 | 80 |
| Comparative Example 3 | 1 | 167.40 | — | 0 |
| | 10 | 162.20 | 3.11 | 30 |
| Comparative Example 4 | 1 | 163.50 | — | 0 |
| | 10 | 157.90 | 3.42 | 40 |

TABLE 5

| | Etch rate (Å/min) | | |
| --- | --- | --- | --- |
| | Nitride layer ($E_{SiNx}$) | Oxide layer ($E_{SiO2}$) | Selectivity ratio ($E_{SiNx}/E_{SiO2}$) |
| Example 12 | 166.30 | 0.11 | 1512 |
| Example 13 | 164.70 | 0.13 | 1267 |
| Example 14 | 164.20 | 0.03 | 5473 |
| Example 15 | 163.30 | 0.04 | 4083 |
| Example 16 | 162.70 | 0.08 | 2034 |
| Example 17 | 164.80 | 0.07 | 2354 |
| Example 18 | 164.90 | 0.05 | 3298 |
| Example 19 | 165.10 | 0.09 | 1834 |
| Example 20 | 165.70 | 0.12 | 1381 |
| Example 21 | 186.30 | 0.18 | 1035 |
| Comparative Example 5 | 170.20 | 2.98 | 57 |
| Comparative Example 6 | 166.00 | 0.32 | 494 |
| Comparative Example 7 | 165.30 | 1.94 | 86 |
| Comparative Example 8 | 165.30 | 0.86 | 190 |
| Comparative Example 9 | 168.20 | 2.23 | 75 |
| Comparative Example 10 | 165.80 | 0.79 | 213 |

TABLE 6

| | Number of batches | Nitride layer etch rate (Å/min) | Nitride layer etch rate drift (%) | Generation level (Å) of oxide layer abnormal growth |
| --- | --- | --- | --- | --- |
| Example 12 | 1 | 166.30 | — | 0 |
| | 10 | 165.60 | 0.42 | 0 |
| Example 13 | 1 | 164.70 | — | 0 |
| | 10 | 164.20 | 0.30 | 0 |
| Example 14 | 1 | 164.20 | — | 0 |
| | 10 | 163.80 | 0.24 | 0 |
| Example 15 | 1 | 163.30 | — | 0 |
| | 10 | 162.90 | 0.24 | 0 |
| Example 16 | 1 | 162.70 | — | 0 |
| | 10 | 162.40 | 0.18 | 0 |
| Example 17 | 1 | 164.80 | — | 0 |
| | 10 | 164.40 | 0.24 | 0 |
| Example 18 | 1 | 164.90 | — | 0 |
| | 10 | 164.70 | 0.12 | 0 |
| Example 19 | 1 | 165.10 | — | 0 |
| | 10 | 164.60 | 0.30 | 0 |
| Example 20 | 1 | 165.70 | — | 0 |
| | 10 | 165.00 | 0.42 | 0 |
| Example 21 | 1 | 186.30 | — | 0 |
| | 10 | 185.50 | 0.43 | 0 |
| Comparative Example 5 | 1 | 170.10 | — | 0 |
| | 10 | 160.90 | 5.41 | 50 |
| Comparative Example 6 | 1 | 158.20 | — | 0 |
| | 10 | 149.50 | 5.50 | 80 |
| Comparative Example 7 | 1 | 167.40 | — | 0 |
| | 10 | 162.20 | 3.11 | 30 |
| Comparative Example 8 | 1 | 163.50 | — | 0 |
| | 10 | 157.90 | 3.42 | 40 |
| Comparative Example 9 | 1 | 167.80 | — | 0 |
| | 10 | 165.60 | 1.31 | 5 |
| Comparative Example 10 | 1 | 168.10 | — | 0 |
| | 10 | 163.10 | 2.97 | 10 |

First, upon reviewing the etch selectivity ratio with respect to the silicon nitride layer relative to the silicon oxide layer, as shown in Tables 3 and 4, the etch selectivity ratio was all excellent as 1000 or more in each of the silicon nitride layer etching compositions of Examples 5 to 11. In addition, it was confirmed that etch rate drift with respect to the silicon nitride layer was remarkably low even though the silicon nitride layer etching composition was reused several times by repeating the etching process.

On the other hand, in each of the silicon nitride layer etching compositions of Comparative Examples 1 to 4, the etch selectivity ratio was less than 500, which was significantly lower than those of Examples of the present invention.

Specifically, upon reviewing the etch selectivity ratios of Examples 5 to 11, it was confirmed that as the amount of the polysiloxane-based compound according to embodiments of the present invention was increased, the number of repeating units of n and m of the polysiloxane-based compound was increased, and the number of repeating units of n was more than that of m, the etch selectivity ratio was high. It was confirmed that Example 7 in which the hydroxy group was bonded to $R^3$ and $R^5$, and hydrogen was bonded to $R^6$ in Chemical Formula 1 had higher etch selectivity ratio with respect to the silicon nitride layer than that of Example 8 in which the ethoxy group was bonded to $R^3$ and $R^5$, and the ethyl group was bonded to $R^6$, and as in Example 9, the etch selectivity ratio was significantly high as 5400 or more when the —OP(=O)(OH)$_2$ group was bonded to $R^3$ and $R^5$ and the —P(=O)(OH)$_2$ group was bonded to $R^6$ in Chemical Formula 1.

In Example 10, an improved etch selectivity by about 500 or more was confirmed when ethanol was added as compared to Example 5.

Further, it was confirmed that in Example 11, the etch rate of the silicon nitride layer could be increased without affecting the selectivity ratio when the fluorine-based compound was included and the amount of the polysiloxane-based compound represented by Chemical Formula 1 was increased.

Next, upon reviewing the etch rate drift of the silicon nitride layer, it was confirmed that in each of the silicon nitride layer etching compositions of Examples 4 to 11, the etch rate drift of the silicon nitride layer was significantly lower when the number of processes was increased. In addition, it could be appreciated that in Examples 4 to 11, the abnormal growth of the silicon oxide layer was not generated at all, and thus a defective rate of the manufactured semiconductor device could be minimized.

In addition, upon reviewing the etch rate drift of the silicon nitride layer, it was confirmed that in each of the silicon nitride layer etching compositions of Examples 1 to 10, the etch rate drift of the silicon nitride layer was significantly lower when the number of processes was increased. In addition, it could be appreciated that in Examples 1 to 10, the abnormal growth of the silicon oxide layer was not generated at all, and thus a defective rate of the manufactured semiconductor device could be minimized.

Upon reviewing the etch selectivity ratio with respect to the silicon nitride layer relative to the silicon oxide layer as shown in Tables 5 and 6, the etch selectivity ratio was all excellent as 1000 or more in each of the silicon nitride layer etching compositions of Examples 12 to 21. In addition, it was confirmed that etch rate drift with respect to the silicon nitride layer was remarkably low even though the silicon nitride layer etching composition was reused several times by repeating the etching process.

On the other hand, in each of the silicon nitride layer etching compositions of Comparative Examples 5 to 10, the etch selectivity ratio was less than 500, which was significantly lower than those of Examples of the present invention.

Specifically, upon reviewing the etch selectivity ratios with respect to each of Examples 12 to 21, it was confirmed that Example 12 including the polysiloxane-based compound having an increased hydrophilicity more than that of Example 13 had a higher etch selectivity ratio with respect to the silicon nitride layer as compared to Example 13. In addition, it was confirmed that as the number of Si—O bonds was increased, the etch selectivity ratio with respect to the silicon nitride layer was remarkably improved. Further, it was confirmed that when the amount of the polysiloxane-based compound was increased, the selectivity ratio was remarkably increased.

Further, unlike Example 19 in which the ethoxy group was bonded to $R^{13}$ and $R^{17}$ and the ethyl group was bonded to $R^{14}$ and $R^{18}$, it was confirmed that in Example 16 in which the hydroxy group was bonded to $R^{13}$ and $R^{17}$ and hydrogen was bonded to $R^4$ and $R^8$, the polysiloxane-based compound was stably included in the aqueous silicon nitride layer etching composition, and thus the etch selectivity ratio was high.

In addition, the etch selectivity ratio was higher in Example 12 in which the hydroxy group was bonded to $R^5$ as compared to Example 20 in which —(CH$_2$)$_3$—SO$_3$H group was bonded to $R^{15}$, and the number of repeating units m was higher than that of Example 12. As a result, it was confirmed that the effect of the hydroxy group was higher on the substituent $R^5$ except for the repeating unit, as compared to the —(CH$_2$)$_3$—SO$_3$H group.

Further, it was confirmed that in Example 21, the etch selectivity ratio was higher than that in Comparative Example even when the fluorine-based compound was included, and the amount ratio of A-5 was increased as compared to that of B-5.

As described above, in Examples, properties such as the etch selectivity ratio of the silicon nitride layer relative to the silicon oxide layer, the etch rate drift and the generation level of the silicon oxide layer abnormal growth, and the like, according to the repeated use, were remarkably superior to those of Comparative Examples.

It was confirmed that Comparative Examples had a low etch selectivity ratio and a high etch rate drift of the silicon nitride layer since the number of repetitions of Si—O bonds and the number of repetitions of specific substituents were small.

Therefore, not only the silicon nitride layer etching composition including the polysiloxane-based compound according to embodiments of the present invention may selectively etch the silicon nitride layer with an excellent etch selectivity ratio, but also the etch rate drift is low even when the etching composition is used several times, thus maintaining the initial etching performance to remarkably increase the production efficiency. In addition, it is possible to minimize damage on the layer quality of the silicon oxide layer during the etching process and to effectively suppress the abnormal growth of the silicon oxide layer, thereby providing a high-quality semiconductor device.

The silicon nitride layer etching composition according to embodiments of the present invention may selectively etch the silicon nitride layer relative to the silicon oxide layer by using the polysiloxane-based compound, and may have a remarkably excellent etch selectivity ratio.

In addition, the silicon nitride layer etching composition according to embodiments of the present invention has a small change in etch rate and a small change in etch selectivity ratio with respect to the silicon nitride layer even when an etching treatment time increases or the etching composition is repeatedly used. Thus, ultimately, the productivity in the semiconductor manufacturing process for selectively etching the silicon nitride layer may be improved.

Further, the silicon nitride layer etching composition according to embodiments of the present invention may have excellent storage stability and may maintain a constant etch rate and etch selectivity ratio with respect to the silicon nitride layer even though silicon nitride layer etching composition is used or stored for a long period of time.

Further, when the silicon nitride layer etching composition according to embodiments of the present invention is used in a semiconductor manufacturing process, there are remarkable effects of reducing the abnormal growth of other layers existing in the vicinity, including the silicon oxide layer.

What is claimed is:

1. A silicon nitride layer etching composition comprising:
a polysiloxane-based compound represented by Chemical Formula 1-1 below, a phosphoric acid, and water;
wherein the polysiloxane-based compound is a mixture of a polysiloxane-based compound in which n is an integer of 0 and a polysiloxane-based compound in which m is an integer of 0, or a polysiloxane-based compound in which n and m are an integer of 1 or more,

[Chemical Formula 1-1]

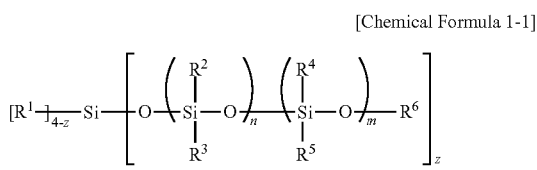

in Chemical Formula 1-1,
$R^1$ is selected from hydrogen, hydroxy, (C1-C20)alkoxy, halogen, (C1-C20)alkyl, amino(C1-C20)alkyl, -L-SO$_3$H, —OP(=O)(OH)$_2$, -L-OP(=O)(OH)$_2$, -L-P(=O)(OH)$_2$, -L-P(=O)(OH)R$^{120}$, —OP(=O)(OH)R$^{110}$, and -L-OP(=O)(OH)R$^{100}$;
one of $R^2$ and $R^3$ is amino(C1-C20)alkyl, and the other is selected from hydrogen, hydroxy, (C1-C20)alkoxy, halogen, (C1-C20)alkyl, amino(C1-C20)alkyl, and —OP(=O)(OH)$_2$;
one of $R^4$ and $R^5$ is selected from -L-SO$_3$H, -L-OP(=O)(OH)$_2$, -L-P(=O)(OH)$_2$, -L-P(=O)(OH)R$^{120}$, and -L-OP(=O)(OH)R$^{100}$, and the other is selected from hydrogen, hydroxy, (C1-C20)alkoxy, halogen, —OP(=O)(OH)$_2$, (C1-C20)alkyl, -L-SO$_3$H, -L-OP(=O)(OH)$_2$, -L-P(=O)(OH)$_2$, -L-P(=O)(OH)R$^{120}$, —OP(=O)(OH)R$^{110}$, and -L-OP(=O)(OH)R$^{100}$;
$R^6$ is selected from hydrogen, (C1-C20)alkyl, —OP(=O)(OH)$_2$, —P(=O)(OH)$_2$, and —OP(=O)(OH)R$^{110}$;
$R^{100}$, $R^{110}$, and $R^{120}$ are each independently (C1-C20)alkyl;
L is (C1-C20)alkylene;
n and m are each independently an integer selected from 0 to 100, and satisfy n+m≥1; and
z is an integer selected from 1 to 4.

2. The silicon nitride layer etching composition of claim 1, wherein the mixture simultaneously includes a polysiloxane-based compound represented by Chemical Formula 2 below and a polysiloxane-based compound represented by Chemical Formula 3 below:

[Chemical Formula 2]

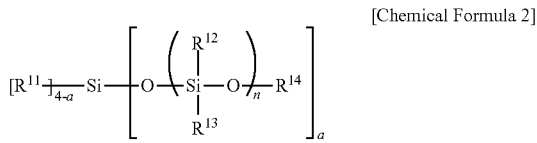

in Chemical Formula 2,
$R^{11}$ is selected from hydrogen, hydroxy, (C1-C20)alkoxy, halogen, (C1-C20)alkyl, —OP(=O)(OH)$_2$, and amino(C1-C20)alkyl;
one of $R^{12}$ and $R^{13}$ is amino(C1-C20)alkyl, and the other is selected from hydrogen, hydroxy, (C1-C20)alkoxy, halogen, (C1-C20)alkyl, —OP(=O)(OH)$_2$, and amino(C1-C20)alkyl;
$R^{14}$ is selected from hydrogen, (C1-C20)alkyl, —OP(=O)(OH)$_2$, —P(=O)(OH)$_2$, and —OP(=O)(OH)R$^{110}$;
$R^{110}$ is (C1-C20)alkyl;
n is an integer selected from 1 to 100; and
a is an integer selected from 1 to 4, and

[Chemical Formula 3]

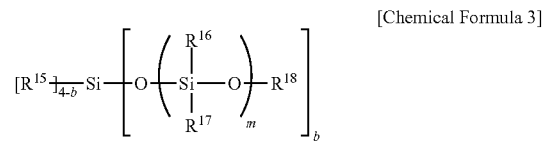

in Chemical Formula 3,
$R^{15}$ is selected from hydrogen, hydroxy, (C1-C20)alkoxy, halogen, (C1-C20)alkyl, -L-SO$_3$H, —OP(=O)(OH)$_2$, -L-OP(=O)(OH)$_2$, -L-P(=O)(OH)$_2$, —OP(=O)(OH)R$^{110}$, -L-P(=O)(OH)R$^{120}$, and -L-OP(=O)(OH)R$^{100}$;
one of $R^{16}$ and $R^{17}$ is selected from -L-SO$_3$H, -L-OP(=O)(OH)$_2$, -L-P(=O)(OH)$_2$, -L-P(=O)(OH)R$^{120}$, and -L-OP(=O)(OH)R$^{100}$, and the other is selected from hydrogen, hydroxy, (C1-C20)alkoxy, halogen, (C1-C20)alkyl, -L-SO$_3$H, —OP(=O)(OH)$_2$, -L-OP(=O)(OH)$_2$, -L-P(=O)(OH)$_2$, —OP(=O)(OH)R$^{110}$, -L-P(=O)(OH)R$^{120}$, and -L-OP(=O)(OH)R$^{100}$;
$R^{18}$ is selected from hydrogen, (C1-C20)alkyl, —OP(=O)(OH)$_2$, —P(=O)(OH)$_2$, and —P(=O)(OH)R$^{110}$;
$R^{100}$, $R^{110}$, and $R^{120}$ are each independently (C1-C20)alkyl;
L is (C1-C20)alkylene;
m is an integer selected from 1 to 100; and
b is an integer selected from 1 to 4.

3. The silicon nitride layer etching composition of claim 2, wherein in Chemical Formula 2,
$R^{11}$ is selected from hydroxy, (C1-C20)alkyl, and amino(C1—C20)alkyl;
one of $R^{12}$ and $R^{13}$ is amino(C1-C20)alkyl, and the other is selected from hydroxy, (C1-C7)alkoxy, and amino(C1-C20)alkyl;
$R^{14}$ is selected from hydrogen, (C1-C20)alkyl, and —P(=O)(OH)$_2$;
n is an integer selected from 1 to 50; and
a is an integer selected from 1 to 4, and
in Chemical Formula 3, $R^{15}$ is selected from hydroxy, (C1-C20)alkyl, and -L-SO$_3$H;
one of $R^{16}$ and $R^{17}$ is -L-SO$_3$H, and the other is selected from hydroxy, (C1-C20)alkoxy, and -L-SO$_3$H;
$R^{18}$ is selected from hydrogen, and (C1-C20)alkyl;
L is (C1-C20)alkylene;
m is an integer selected from 1 to 50; and
b is an integer selected from 1 to 4.

4. The silicon nitride layer etching composition of claim 2, wherein in Chemical Formula 2,
$R^{11}$ is selected from hydroxy, (C1-C7)alkyl, and amino(C1-C7)alkyl;
one of $R^{12}$ and $R^{13}$ is amino(C1-C7)alkyl, and the other is selected from hydroxy, (C1-C7)alkoxy, and amino(C1-C7)alkyl;
$R^{14}$ is selected from hydrogen, (C1-C7)alkyl, and —P(=O)(OH)$_2$;
n is an integer selected from 2 to 20; and
a is an integer selected from 2 to 4, and
in Chemical Formula 3, $R^{15}$ is selected from hydroxy, (C1-C7)alkyl, and -L-SO$_3$H;

one of $R^{16}$ and $R^{17}$ is -L-SO$_3$H, and the other is selected from hydroxy, (C1-C7)alkoxy, and -L-SO$_3$H;

$R^{18}$ is selected from hydrogen and (C1-C7)alkyl;

L is (C1-C7)alkylene;

m is an integer selected from 2 to 20, and b is an integer selected from 2 to 4.

5. The silicon nitride layer etching composition of claim 2, wherein Chemical Formula 2 is selected from the polysiloxane-based compound represented by Structural Formula 1 below and Chemical Formula 3 is selected from the polysiloxane-based compound represented by Structural Formula 2 below:

[Structural Formula 1]

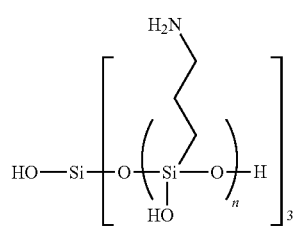

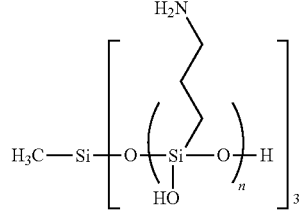

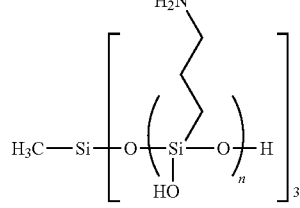

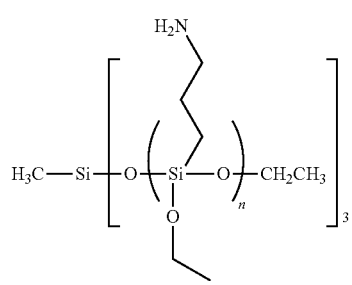

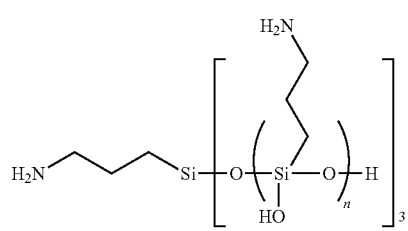

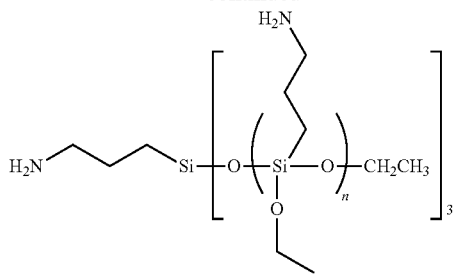

[Structural Formula 2]

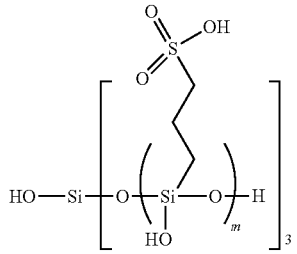

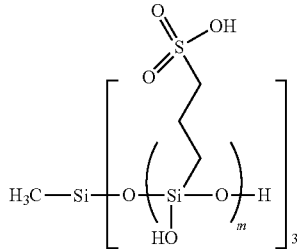

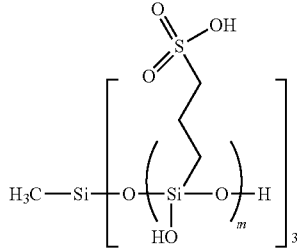

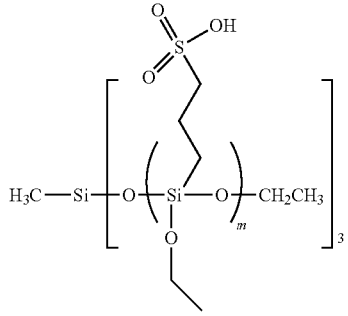

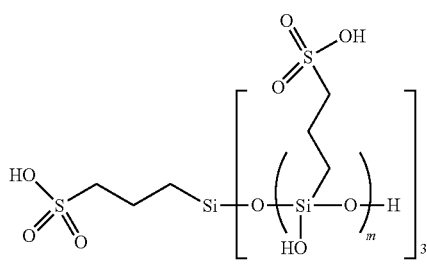

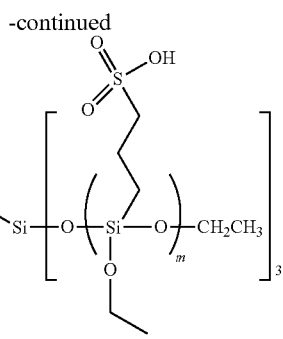

in Structural Formulas 1 and 2, n and m are each independently an integer selected from 1 to 100.

6. The silicon nitride layer etching composition of claim 1, wherein the mixture includes Chemical Formula 2 and Chemical Formula 3 in a weight ratio of 1:99 to 99:1.

7. The silicon nitride layer etching composition of claim 1, wherein in Chemical Formula 1-1, n and m are each independently an integer selected from 1 to 90;

$R^1$ is amino(C1-C20)alkyl;

one of $R^2$ and $R^3$ is amino(C1-C20)alkyl, and the other is selected from hydroxy, (C1-C20)alkoxy, —OP(=O)(OH)$_2$, and amino(C1-C20)alkyl;

one of $R^4$ and $R^5$ is -L-SO$_3$H, and the other is selected from hydroxy, (C1-C20)alkoxy, —OP(=O)(OH)$_2$, and -L-SO$_3$H;

$R^6$ is selected from hydrogen, (C1-C20)alkyl, and —P(=O)(OH)$_2$;

L is (C1-C20)alkylene;

z is an integer selected from 1 to 4; and two different repeating units denoted by n and m are selected from a block form, a random form, and an alternating form.

8. The silicon nitride layer etching composition of claim 1, wherein in Chemical Formula 1-1, $R^1$ is amino(C1-C7)alkyl;

one of $R^2$ and $R^3$ is amino(C1-C7)alkyl, and the other is selected from hydroxy, (C1-C7)alkoxy, —OP(=O)(OH)$_2$, and amino(C1-C7)alkyl;

one of $R^4$ and $R^5$ is -L-SO$_3$H, and the other is selected from hydroxy, (C1-C7)alkoxy, —OP(=O)(OH)$_2$, and -L-SO$_3$H;

$R^6$ is selected from hydrogen, (C1-C7)alkyl, and —P(=O)(OH)$_2$;

L is (C1-C7)alkylene;

n and m are each independently an integer selected from 2 to 70;

z is 2 to 4; and two different repeating units denoted by n and m are selected from a block form, a random form, and an alternating form.

9. The silicon nitride layer etching composition of claim 1, wherein Chemical Formula 1-1 is at least one or more selected from the polysiloxane-based compound represented by Structural Formula 3 below:

[Structural formula 3]

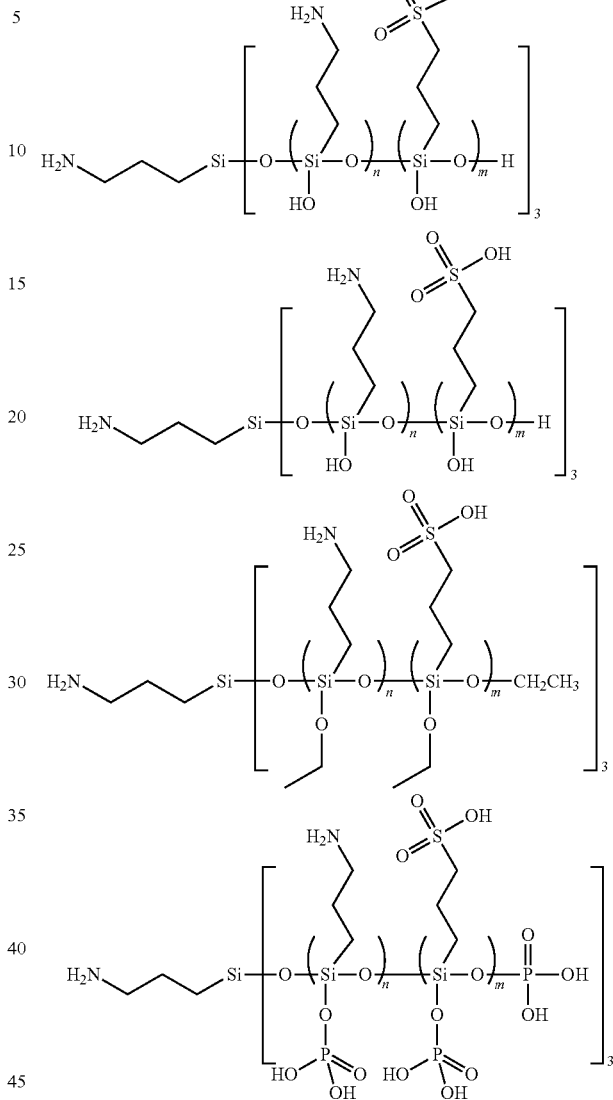

in Structural Formula 3, n and m are each independently an integer selected from 0 to 100, and satisfy n+m≥1.

10. The silicon nitride layer etching composition of claim 1, wherein the silicon nitride layer etching composition includes 0.005 to 10 wt % of the polysiloxane-based compound, 60 to 90 wt % of the phosphoric acid, and a remaining amount of water, based on a total weight of the composition.

11. The silicon nitride layer etching composition of claim 1, wherein the silicon nitride layer etching composition satisfies an etch selectivity ratio represented by Relational Expression 1 below:

$$500 \leq E_{SiNx}/E_{SiO2} \qquad \text{[Relational Expression 1]}$$

in Relational Expression 1, $E_{SiNx}$ is an etch rate of a silicon nitride layer, and $E_{SiO2}$ is an etch rate of a silicon oxide layer.

12. The silicon nitride layer etching composition of claim 1, wherein an etch rate drift of a silicon nitride layer after repeating an etching process satisfies Relational Expression 2 below:

$$\Delta ERD_{SiNx} \leq 1\% \quad \text{[Relational Expression 2]}$$

in Relational Expression 2, $\Delta ERD_{SiNx}$ is an etch rate drift relative to an initial etch rate with respect to the silicon nitride layer.

13. The silicon nitride layer etching composition of claim 1, further comprising:

an alcohol-based solvent.

14. The silicon nitride layer etching composition of claim 1, further comprising:

a fluorine-based compound.

15. A method of manufacturing a semiconductor device comprising:

an etching process using the silicon nitride layer etching composition of claim 1.

* * * * *